(12) United States Patent
Wakabayashi et al.

(10) Patent No.: US 6,755,092 B2
(45) Date of Patent: Jun. 29, 2004

(54) CONVEYING DEVICE

(76) Inventors: Takenori Wakabayashi, 6-6-204, Suzukakedai 4-chome, Sanda-shi, Hyogo 669-1322 (JP); Satoshi Nii, 7-2-810, Imazutatsumi-cho, Nishinomiya-shi, Hyogo 663-8223 (JP); Masashi Kamitani, 2-5-5-303, Yamate-dai, Ibaraki-shi, Osaka 567-0009 (JP); Michio Taniguchi, 9-17-5, Tsukushigaoka, Kita-ku, Kobe-shi, Hyogo 651-1212 (JP)

( * ) Notice: Subject to any disclaimer, the term of this patent is extended or adjusted under 35 U.S.C. 154(b) by 20 days.

(21) Appl. No.: 10/354,835

(22) Filed: Jan. 30, 2003

(65) Prior Publication Data
US 2003/0110878 A1 Jun. 19, 2003

Related U.S. Application Data

(60) Division of application No. 09/586,418, filed on Jun. 2, 2000, now Pat. No. 6,543,306, which is a continuation-in-part of application No. 09/454,438, filed on Dec. 3, 1999, now Pat. No. 6,363,808.

(30) Foreign Application Priority Data

Dec. 4, 1998 (JP) .......................................... 10-345362

(51) Int. Cl.$^7$ ............................................... H02K 16/00
(52) U.S. Cl. ................. 74/409.03; 414/744.2; 310/112; 901/23
(58) Field of Search .................... 74/490.03; 414/744.1, 414/744.2, 744.5, 744.8, 939; 901/23; 310/112, 114

(56) References Cited

U.S. PATENT DOCUMENTS 4,648,785 A  3/1987  Nakagawa et al.
5,720,590 A  2/1998  Hofmeister
5,813,823 A  9/1998  Hofmeister
5,899,658 A  5/1999  Hofmeister
6,189,404 B1  2/2001  Hatake et al.

FOREIGN PATENT DOCUMENTS

| EP | 0316998 | 11/1988 |
|---|---|---|
| JP | 2761438 | 3/1998 |
| JP | 11-215768 | 6/1999 |
| JP | 11-215769 | 8/1999 |
| JP | 11-215780 | 8/1999 |
| JP | 11-215790 | 8/1999 |
| JP | 11-220863 | 8/1999 |
| JP | 2000-069741 | 3/2000 |
| WO | WO94/23911 | 10/1994 |

OTHER PUBLICATIONS

Copy of European Search Report for European patent application No. 99309677, dated Feb. 10, 2003, 2 pages.

*Primary Examiner*—William C. Joyce
(74) *Attorney, Agent, or Firm*—Marshall, Gerstein & Borun LLP

(57) ABSTRACT

A conveying device in which a conveying arm assembly can be quickly set in a conveying position and can be rapidly stabilized in the conveying position includes a conveying arm assembly, a fixed shaft, at least one set of hollow operating shafts which are necessary for controlling an operation of the conveying arm assembly, and a motor provided between the fixed shaft and each of the operating shafts. The one set of operating shafts are attached to the fixed shaft such that they can be rotated coaxially with respect to the fixed shaft outside fixed shaft and are arranged in an axial direction of the fixed shaft. The conveying arm assembly is attached to an end portion of the operating shaft close to the ended of the fixed shaft. The motor comprises a stator provided on the fixed shaft and a rotor provided on each of the operating shafts such that it is opposed to the stator on an outer peripheral side of the stator. The stator is accommodated in a concave portion formed on an outer peripheral face of the fixed shaft.

4 Claims, 14 Drawing Sheets

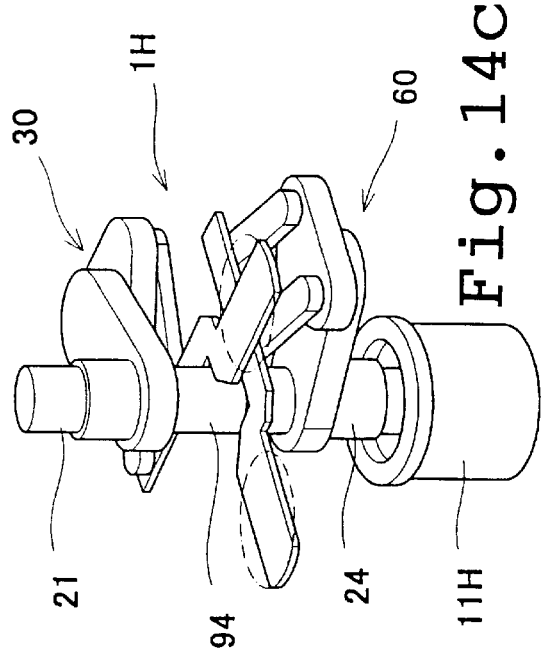
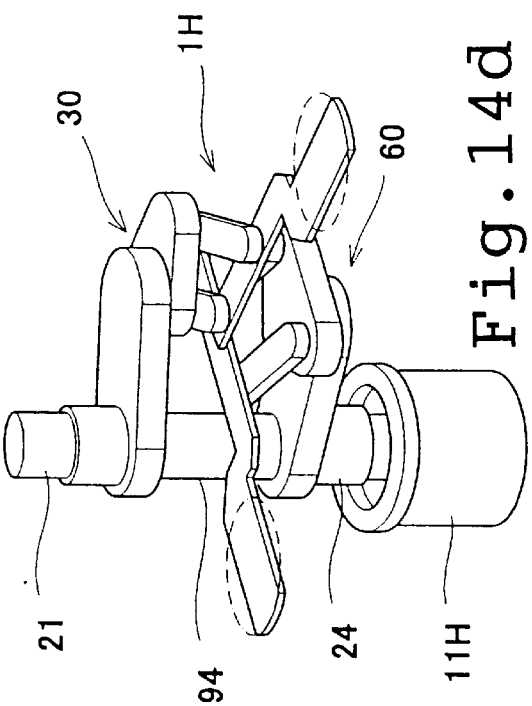
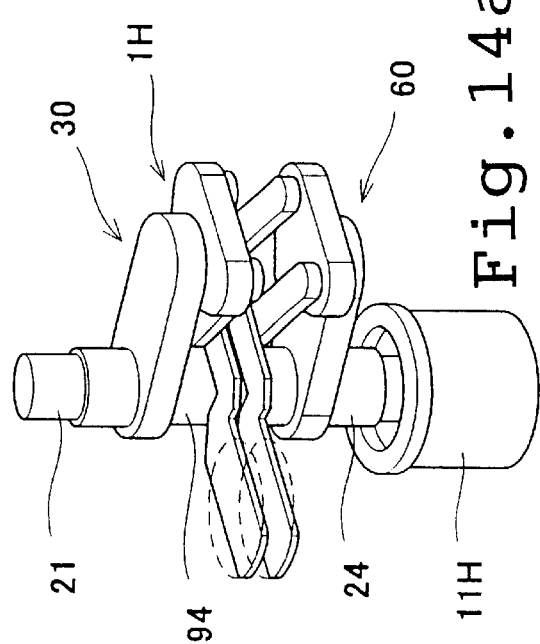
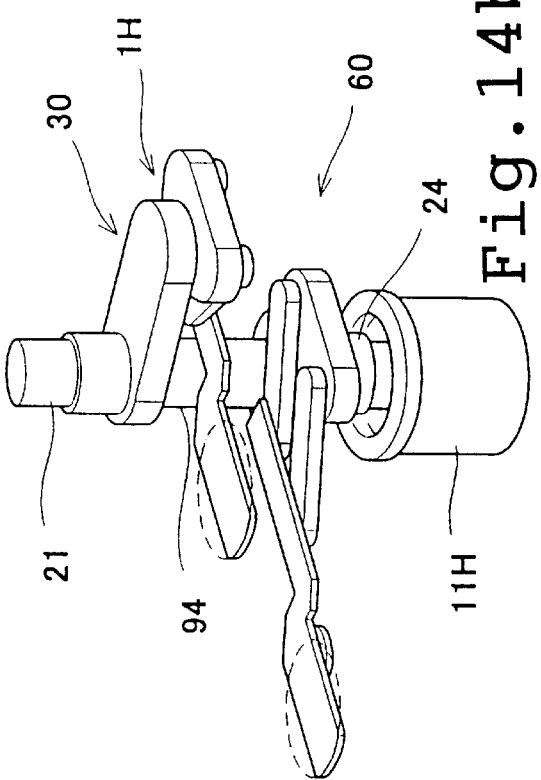

CONVEYING DEVICE

This is divisional application of U.S. Ser. No. 09/586,418, filed Jun. 2, 2000, now U.S. Pat. No. 6,543,306 which is a continuation-in-part application of U.S. Ser. No. 09/454,438, filed Dec. 3, 1999, now U.S. Pat. No. 6,363,808, which is incorporated herein by reference in its entirety.

BACKGROUND OF THE INVENTION

1. Field of the Invention

The present invention relates to a conveying device for conveying a work piece such as a silicon wafer, for example.

2. Description of the Related Art

For etching of a wafer, CVD (chemical vapor deposition) and the like, for example, it is necessary to convey the wafer in a multi-chamber in a clean and ultra-high vacuum environment. In such an environment, the conveying device operates. A conveying device which does not require the use of a magnetic fluid seal, that is, a conveying device provided with a separating wall between a rotor and a stator in a motor has been devised in order to prevent the environment in the chamber from being deteriorated. The conveying devices described in Japanese Patent No. 2,761,438 and U.S. Pat. No. 5,720,590 are examples of such conveying devices. FIG. 9 is a longitudinal sectional view showing a conveying device 101 having the same basic structure as the conveying devices described in the above-mentioned publications. The conveying device 101 comprises a coaxial shaft mechanism including a first shaft 121 and a second shaft 122 which are independently rotatable, and a conveying arm assembly 130 fixed to the upper ends of the shafts 121 and 122. The first shaft 121 extends downward from the lower end of the second shaft 122 and penetrates the second shaft 122. A rotor R' is attached to the outer peripheral sides of the first shaft 121 and the second shaft 122, and a stator S' is attached to a housing 190 accommodating the first shaft 121 and the second shaft 122. A motor M' is constituted by the rotor R' and the stator S'. By controlling the rotation of the motor M', the expansion, contraction and turn of the conveying arm assembly 130 can be controlled. The reference numeral 145 denotes an optical encoder for detecting the rotation of the first and second shafts 121 and 122.

In the conveying device 101 having such a structure, it is required that the conveying arm assembly 130 should be quickly set in a conveying position and be rapidly stabilized in the conveying position. For this purpose, adequate characteristics are required for the shafts 121 and 122. FIG. 10 is a chart showing a process of controlling the rotation of the shaft, wherein an axis of ordinate indicates angular velocity of the shaft and an axis of abscissa indicates time. In general, the rotation of the shaft is controlled to reach a stopping step "e" from a stopping step "a" through an accelerating step "b", a constant-velocity rotating step "c" and a decelerating step "d" as shown in FIG. 10. In the conveying device 101, it is necessary to rapidly accelerate or decelerate the shafts 121 and 122, that is, to increase an angular acceleration at the accelerating step "b" and an angular deceleration the decelerating step "d" shown in FIG. 10 in order to quickly set the conveying arm assembly 130 in the conveying position. Moreover, the oscillation of the angular velocity is observed in the early stage of the constant-velocity rotating step "c" and that of the stopping stage "e" in FIG. 10. In order to quickly stabilize the conveying arm assembly 130 in the conveying position, however, it is necessary to reduce times t1 and t2 taken to cause the oscillated angular velocity to converge on a constant value, that is, stabilizing times.

With an increase in the size of the work piece, furthermore, the conveying device should have the characteristics that a conveying distance is long and the conveying device is resistant to a great load. In order to satisfy these requirements, the torsional rigidity of each of the shafts 121 and 122 should be increased. If it is desired to increase the torsional rigidity of each of the shafts 121 and 122, it is necessary to shorten the shafts 121 and 122 or to increase a modulus of section of each of the shafts 121 and 122.

Moreover, when the conveying arm assembly 130 connected to the two shafts 121 and 122 is to be driven, the synchronous driving of the two shafts 121 and 122 is required. For this purpose, it is necessary to reduce a difference in the torsional rigidity between the two shafts 121 and 122. In order to reduce the difference in the torsional rigidity between the two shafts 121 and 122, it is necessary to reduce a difference in a length between the two shafts 121 and 122 and a difference in a modulus of section between the shafts 121 and 122.

In the conveying device 101, however, the first shaft 121 extends downward from the lower end of the second shaft 122 to penetrate the second shaft 122. For this reason, particularly, it is hard to reduce the length of the inside shaft 121 and to increase an outside diameter thereof. If the outside diameter is increased, the inside and outside diameters of the second shaft 122 should also be increased. Consequently, the outside dimensions and weights of both the shafts 121 and 122 are increased. Therefore, a large-sized motor is required for controlling the expansion, contraction and turn of the conveying arm assembly 130. Moreover, it is impossible to avoid an increase in the outside diameter of the housing 190.

With the structure of the conveying device 101, furthermore, the shaft 121 has a greater length and a smaller modulus of section than the shaft 122. Therefore, the difference in the torsional rigidity between both the shafts 121 and 122 is great. Accordingly, both the shafts 121 and 122 cannot be synchronously driven by rapid acceleration and deceleration.

In order to perform positioning with high precision, run-out of the shaft should be small. In the conveying device 101, the run-out is generated on the shaft 122 due to the precision of a bearing 100B during the rotation thereof. Similarly, when the shaft 121 is relatively rotated with respect to the shaft 122, relative run-out is generated on the shaft 121 with respect to the shaft 122 due to the precision of a bearing 100B'. In the conveying device 101, therefore, when the shaft 121 and the shaft 122 are rotated at the same time, accumulative run-out is generated on the shaft 121 due to the precision of each of the bearings 100B and 100B'. Consequently, it is impossible to perform the positioning with high precision.

The conveying device 110 has such a structure that the operation of one conveying arm assembly 130 is controlled by a set of shafts 121 and 122. If the operations of a plurality of conveying arm assemblies are to be controlled by plural sets of shafts, the above-mentioned problems become more remarkable. For example, if two conveying arm assemblies are to be controlled by two sets of shafts, four shafts are coaxially provided to control the operation of one of the conveying arm assemblies by means of two inner shafts and that of the other conveying arm assembly by means of two outer shafts. With such a structure, it is harder to reduce the length of the inner shaft and to increase the modulus of section thereof. Furthermore, the torsional rigidity of the inner shaft cannot be increased. Moreover, the lengths and moduli of section of innermost and outermost shafts have very great differences. Therefore, a difference in the torsional rigidity becomes very great. In particular, the innermost shaft is attached to the housing through much more bearings. Therefore, the accumulation of the run-out due to the precision of the bearing is increased so that the run-out becomes very great, resulting in poor positioning precision.

In solving the above-described problems, it is desirable to make the vacuum chamber and a device (semiconductor fabricating device herein) using the vacuum chamber as compact as possible. Further, the conveying device requires sufficient strength.

By way of example, the related arts associated with the problems are disclosed in Japanese Patent Application Publication No. Hei., 11-220863 and Japanese Patent Application Publication No. 2000-69741. However, these arts do not present how to achieve compactness of the vacuum chamber and the device using the vacuum chamber and how to ensure the strength of the conveying device.

SUMMARY OF THE INVENTION

It is an object of the present invention to provide a conveying device in which the torsional rigidity of a shaft can be enhanced without increasing the dimension of the conveying device and a difference in the torsional rigidity between a plurality of shafts can be reduced, run-out due to the precision of a bearing is not accumulated, compactness of a vacuum chamber and a device using the vacuum chamber can be achieved, and strength of the conveying device can be ensured.

The present invention provides a conveying device comprising a conveying arm assembly, a fixed shaft, at least one set of hollow operating shafts which are necessary for controlling an operation of the conveying arm assembly, and a motor provided between the fixed shaft and each of the operating shafts. The one set of operating shafts are attached to the fixed shaft such that they can be rotated coaxially with respect to the fixed shaft on an outside of the fixed shaft and are arranged in an axial direction of the fixed shaft. The motor comprises a stator provided on the fixed shaft and a rotor provided on each of the operating shafts such that it is opposed to the stator on an outside of the stator. Thus, the operating shafts are provided on the outside of the fixed shaft. Consequently, the outside diameters and moduli of section of the operating shafts are increased. Even if the outside diameters are increased, the weights are comparatively small because the operating shafts have hollow structures and annular cross-sections. Moreover, it is not necessary for one of the operating shafts to penetrate the other operating shaft. Therefore, both the operating shafts can be shortened. Thus, the torsional rigidity of the operating shaft can be enhanced without increasing the dimension of the conveying device.

In addition, the lengths and cross-sectional shapes of both the operating shafts can be set almost identically. A difference in the torsional rigidity between both the operating shafts can be reduced.

Thus, the torsional rigidity of the operating shaft can be enhanced without increasing the dimension of the conveying device. Therefore, the operating shaft can be rapidly accelerated and decelerated. In addition, synchronous driving can be performed at a high speed by reducing a difference in the torsional rigidity between a plurality of operating shafts. Consequently, the conveying arm assembly can be quickly set in the conveying position. Furthermore, even if the angular velocity of the operating shaft is oscillated, it rapidly converges. Therefore, it is possible to reduce a time taken for stabilizing the conveying arm assembly in the conveying position. As a result, a work for setting the conveying arm assembly in the conveying position can be rapidly performed.

Moreover, a bearing can generally be used for rotatably holding the operating shafts. Each of the operating shafts are not held through a bearing attached to the other operating shaft but are directly held by means of a bearing attached to the fixed shaft. Therefore, run-out can be reduced without the accumulation of the run-out of the operating shaft.

Furthermore, the rotor which serves as a point of action of the motor is situated in a point which is more distant from the center of rotation. Therefore, it is possible to obtain a necessary torque even if the height of the rotor is reduced. Accordingly, the torsional rigidity can be increased by shortening the operating shaft. In addition, the height of the conveying device can also be reduced.

The torsional rigidity of the operating shaft is increased. Consequently, a resonance frequency can be more increased than a frequency included in a motor driving signal. Thus, a resonance can be avoided.

The above-mentioned conveying device may further comprise a plurality of conveying arm assemblies and plural sets of operating shafts for controlling operations of the conveying arm assemblies. Even if the number of the operating shafts is increased by such a structure, the outside diameters of the operating shafts do not need to be reduced and their torsional rigidities can be kept great. Moreover, even if the number of the operating shafts is increased, the cross-sectional shapes of all the operating shafts can be set almost identically. Consequently, a difference in the torsional rigidity can be reduced. Furthermore, even if the number of the operating shafts is increased, respective bearings can be all attached to the fixed shaft. Therefore, the run-outs of all the operating shafts can be reduced almost identically.

In the above-mentioned conveying device, furthermore, a rotation detecting portion capable of detecting rotation of the operating shaft may be provided between the fixed shaft and the operating shaft. The rotation detecting portion may be constituted by a resolver type position detector or an optical encoder, for example.

In the above-mentioned conveying device, moreover, the fixed shaft may be attached, with airtightness, to a wall portion of a vacuum chamber so that the conveying arm assembly can be put in a vacuum environment.

Furthermore, the above-mentioned conveying device may comprise a lift mechanism for bringing the fixed shaft up and down in order to bring the conveying arm assembly up and down. In this case, the fixed shaft may be attached to a wall portion of a vacuum chamber through the lift mechanism and a flexible seal member may be provided between the fixed shaft and the wall portion of the vacuum chamber so that the conveying arm assembly can be put in a vacuum environment.

In the above-mentioned conveying device, moreover, a stator accommodating space isolated from an outer peripheral face of the fixed shaft may be formed in the fixed shaft, the stator being accommodated in the stator accommodating space. According to such a structure, the stator can be put in the space isolated from the space where the operating shafts are present. Consequently, in particular, also in the case where the stator is attached to the vacuum chamber, the vacuum environment is not deteriorated.

A concave portion may be formed on the fixed shaft to be opened on the outer peripheral face of the fixed shaft and the opening of the concave portion may be closed with airtightness by a separating wall member so that the stator accommodating space is formed.

In the above-mentioned conveying device, furthermore, a passage for communicating from an end face of the fixed shaft to the stator accommodating space may be formed in the fixed shaft. According to such a structure, heat generated on the stator can be discharged to an outside space through the passage. Moreover, the passage can also be utilized for distributing an electric wire to supply power to the stator.

Further, the present invention provides a conveying device comprising: a conveying arm assembly; a fixed shaft; a set of hollow operating shafts connected to the conveying arm assembly for controlling an operation of the conveying arm assembly; and a motor provided between the fixed shaft and each of the operating shafts, wherein an end of the fixed shaft is attached to an inner face of a wall portion of a vacuum chamber with airtightness, the set of operating shafts are attached to the fixed shaft such that they can be rotated coaxially with respect to the fixed shaft on an outside of the fixed shaft and are arranged in an axial direction of the fixed shaft, the conveying arm assembly is attached to an end portion of the operating shaft situated closer to an end of the fixed shaft, the end portion being situated closer to the end of the fixed shaft such that the conveying arm assembly extends in a direction substantially orthogonal to the fixed shaft, and the motor comprises a stator provided on the fixed shaft and a rotor provided on each of the operating shafts such that the rotor is opposed to the stator on an outside of the stator, and the stator is accommodated in a concave portion formed on an outer peripheral face of the fixed shaft.

In general, the fixed shaft is attached to a lower wall portion of the vacuum chamber. In this case, when upper and lower wall portions of the vacuum chamber are made closer to the conveying arm assembly except the periphery of a portion of the conveying device where the motor is provided, an inner space of the vacuum chamber can be made correspondingly smaller, and therefore the vacuum chamber can be made compact.

(1) In cases of the conveying devices described in Japanese Patent No. 2761438 and U.S. Pat. No. 5,720,590, when the upper and lower wall portions are made closer to the conveying arm assembly, the inner space of the vacuum chamber can be made correspondingly smaller. However, in general, the lower wall portion of the vacuum chamber is positioned to have a predetermined height from an installation floor and other devices necessary for the device using the vacuum chamber are placed in a space formed between the lower wall portion of the vacuum chamber and the installation floor. In the case of the semiconductor fabricating device, a vacuum pump, various gas supply devices, a high-frequency power matching device and the like are placed in this space. On the other hand, in the above conveying device, a part of this space is occupied by a portion of the device where the motor is provided, and therefore this space is not efficiently utilized.

(2) For instance, in a case where the conveying arm assembly is attached to an end portion of the fixed shaft that is not attached to the vacuum chamber, i.e., an upper end portion of the fixed shaft, using the techniques described in the Japanese Patent Application Publication No. Hei. 11-220863 and Japanese patent Application Publication 2000-69741, when a flange portion fixed into an attaching hole formed in a lower wall portion is formed as being concave so as to cover a peripheral portion of the portion to which the fixed shaft is attached and the upper and lower wall portions of the vacuum chamber can be made closer to the conveying arm assembly, the inner space of the vacuum chamber can be made smaller.

However, as in the case of (1), because the part of the space formed between the lower wall portion of the vacuum chamber and the installation floor is occupied by the flange portion of the conveying device, this space is not efficiently utilized.

On the other hand, in a case where the conveying arm assembly is attached to the end portion of the fixed shaft that is attached to the vacuum chamber, i.e., the lower end portion of the fixed shaft, when the upper wall portion of the vacuum chamber is made closer to the conveying arm assembly except the periphery of the portion of the conveying device where the motor is provided, the inner space of the vacuum chamber can be made smaller and the space formed between the lower wall portion of the vacuum chamber and the installation floor is efficiently utilized because the flange portion of the conveying device is not present in this space. In brief, since many devices necessary for the device using the vacuum chamber can be accommodated in a smaller installation area, the device using the vacuum chamber as well as the vacuum chamber can be made compact.

In this case, moreover, although a portion of the upper wall portion of the vacuum chamber that covers the portion of the conveying device where the motor is provided is protruded upward, this configuration is convenient because an empty space is formed above the vacuum chamber.

Further, since the concave portion is formed on the outer peripheral face of the fixed shaft to accommodate the stator therein, a column portion extending over the whole length of the fixed shaft is present in a central portion thereof. Thereby, the weight of the conveying device itself can be satisfactorily supported. Consequently, the strength of the conveying device can be ensured.

Furthermore, the present invention provides a conveying device comprising: two conveying arm assemblies; a fixed shaft; two sets of hollow operating shafts connected to the two conveying arm assemblies for controlling operations of the conveying arm assemblies, respectively; and a motor provided between the fixed shaft and each of the operating shafts, wherein an end of the fixed shaft is attached to an inner face of a wall portion of a vacuum chamber with airtightness, the two sets of operating shafts are attached to the fixed shaft such that they can be rotated coaxially with respect to the fixed shaft on an outside of the fixed shaft and are arranged as two units in an axial direction of the fixed shaft, the two conveying arm assemblies are attached to end portions of operating shafts to extend in a direction substantially orthogonal to the fixed shaft, respectively, the end portions being adjacent to each other and the operating shafts belonging to different sets and being adjacent to each other, the motor comprises a stator provided on the fixed shaft and a rotor provided on each of the operating shafts such that the rotor is opposed to the stator on an outside of the stator, and the stator is accommodated in a concave portion formed on an outer peripheral face of the fixed shaft.

With such a structure, since the two conveying arm assemblies are situated in the central portion of the fixed shaft, a wall portion of the vacuum chamber to which the fixed shaft is attached and a wall portion opposite thereto can be made closer to the conveying arm assemblies, respectively, except the periphery of the portion of the conveying device where the motor is provided. Thereby, the inner space of the vacuum chamber can be made as small as possible. Consequently, the vacuum chamber can be made as compact as possible.

In the cases of the conveying devices described in the Japanese Patent No. 2761438 and U.S. Pat. No. 5,720,590, since an operating shaft is present inside the fixed shaft, it is impossible to attach the two conveying arm assemblies to the adjacent end portions of the operating shafts belonging to different sets and being adjacent to each other unlike the case described above.

Further, since the concave portion is formed on the outer peripheral face of the fixed shaft to accommodate the stator therein, a column portion extending over the whole length of the fixed shaft is present in a central portion thereof. Thereby, the weight of the conveying device itself can be satisfactorily supported. Consequently, the strength of the conveying device can be ensured.

In this case, preferably, the fixed shaft may be constituted by two fixed shaft portions, each of which is for each set of the two sets of operating shafts, and a connecting portion connecting the two fixed shaft portions.

With such a structure, because a conveying device including two conveying arm assemblies can be made by combining two conveying units each including one conveying arm assembly, maintenance cost can be reduced.

Furthermore, since this conveying device can be separated into the conveying units, workability of maintenance such as replacement of the motor is improved as compared with the case where the fixed shaft is integrally formed.

It is desirable to make the thickness of the connecting portion as large as possible so as to support the weight of the conveying device itself and ensure the strength of the device.

In this case, moreover, an opening of the concave portion may be closed by a separating wall member and a passage communicating with the concave portion may be formed in an end face of the fixed shaft that is attached to the vacuum chamber.

In the above-described case, the fixed shaft may include at least a cylindrical portion having a large thickness and extending over the whole length of the fixed shaft in a central portion of the fixed shaft. With such a structure, the weight of the conveying device itself can be suitably supported and the strength of the conveying device can be ensured.

The object as well as other objects, features and advantages of the invention will become more apparent to those skilled in the art from the following description with reference to the accompanying drawings.

BRIEF DESCRIPTION OF THE DRAWINGS

FIGS. 12a, 12b are views showing the appearance of the conveying device of FIG. 11, wherein FIG. 12a shows a state in which a conveying arm assembly is contracted and FIG. 12b shows a state in which the conveying arm assembly is expanded;

FIGS. 14a–14c are views showing the appearance of the conveying device of FIG. 13, wherein FIG. 14a shows a state in which conveying arm assemblies are contracted, FIG. 14b shows a state in which one of the conveying arm assemblies is expanded from the state of FIG. 14a, FIG. 14c shows a state in which one of the conveying arm assemblies is turned from the state of FIG. 14a, and FIG. 14d shows a state in which one of the conveying arm assemblies is expanded from the state of FIG. 14c.

DETAILED DESCRIPTION OF THE PREFERRED EMBODIMENTS

Figure 1:
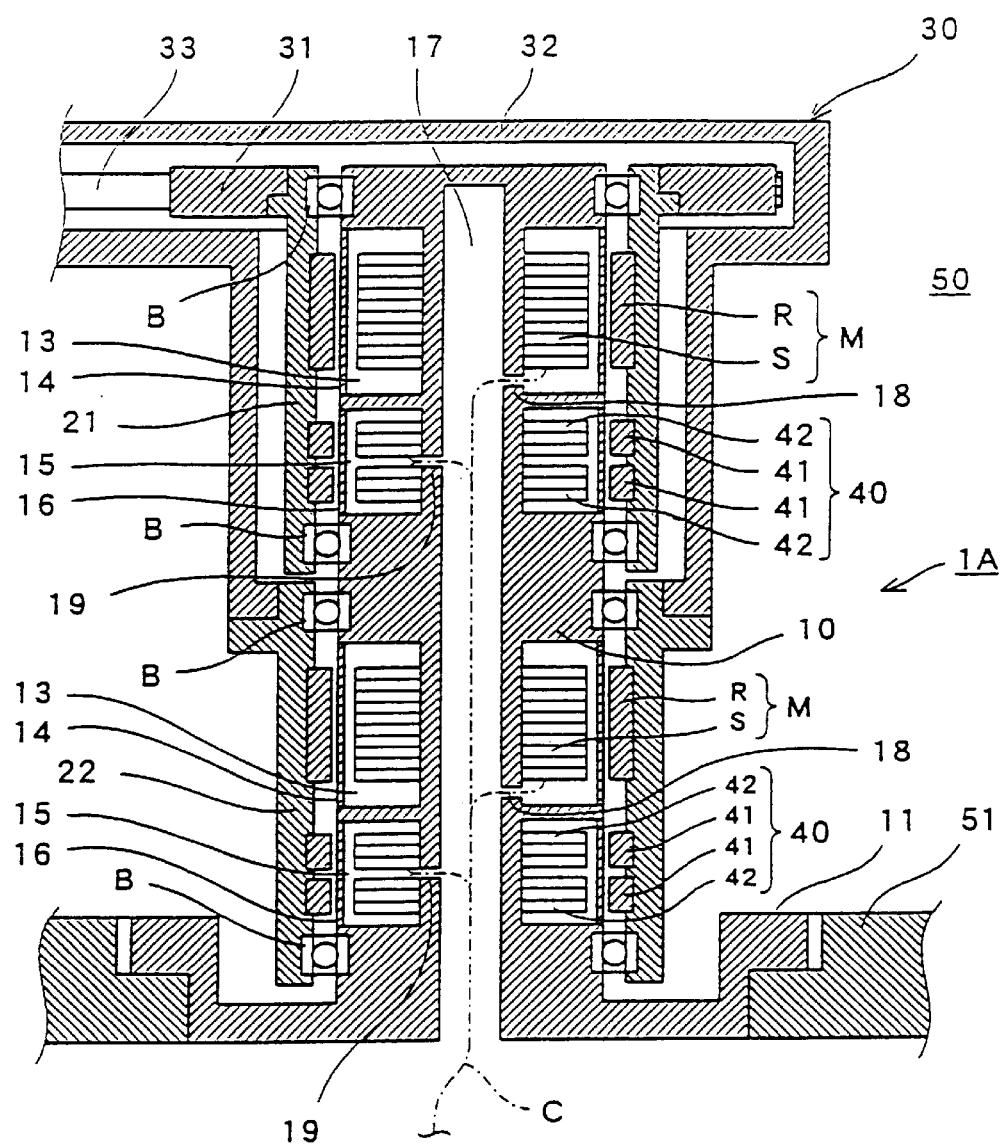
FIG. 1 is a longitudinal sectional view showing a conveying device according to a first embodiment of the present invention.

Preferred embodiments of the present invention will be described below with reference to the drawings. FIG. 1 is a longitudinal sectional view showing a conveying device 1A according to a first embodiment of the present invention. The conveying device 1A is mainly constituted by a conveying arm assembly 30, a fixed shaft 10, a set of operating shafts 21 and 22, a motor M and a resolver type position detector 40. The conveying arm assembly 30 is attached to the upper ends of the operating shafts 21 and 22. In order to control the operation of the conveying arm assembly 30, two operating shafts are required. In the present embodiment, the two operating shafts 21 and 22 make a set to control the operation of the conveying arm assembly 30. The lower end of the fixed shaft 10 is provided integrally with a flange portion 11. The flange portion 11 is fixed into an attaching hole formed on a wall portion 51 of a vacuum chamber 50. More specifically, the fixed shaft 10 is attached, with airtightness, to the wall portion 51 of the vacuum chamber 50 through the flange portion 11. Thus, the conveying arm assembly 30 is put in a vacuum environment in the vacuum chamber 50.

The operating shafts 21 and 22 have hollow structures and are provided coaxially with respect to the fixed shaft 10 to accommodate the fixed shaft 10 therein, that is, to be situated on the outside of the fixed shaft 10. The operating shafts 21 and 22 are rotatably attached to the fixed shaft 10 through a bearing B respectively. The operating shafts 21 and 22 are attached to be piled up in a vertical direction, that is, to be arranged in two stages in the axial direction of the fixed shaft 10.

The motor M is constituted by a permanent magnetic rotor R and an electromagnetic stator S, and is provided between the fixed shaft 10 and each of the operating shafts 21 and 22. The rotor R is fixed to the inner peripheral side of each of the operating shafts 21 and 22, and the stator S is provided in a position corresponding to the rotor R on the outer peripheral side of the fixed shaft 10. In the drawing, the upper motor M serves to control the rotation of the operating shaft 21, and the lower motor M serves to control the rotation of the operating shaft 22. A concave portion 13 is formed on the fixed shaft 10. The concave portion 13 is opened on the outer peripheral face of the fixed shaft 10 and annularly takes a round of the outer periphery in the circumferential direction of the fixed shaft 10. The opening of the concave portion 13 is closed by a separating wall member 14. The separating wall member 14 has a cylindrical shape and has upper and lower ends welded to the peripheral edge of the opening of the concave portion 13. The opening of the concave portion 13 is closed with airtightness by the separating wall member 14. Consequently, a stator accommodating space isolated from the outer peripheral face of the fixed shaft 10 is formed. The stator S is accommodated in the stator accommodating space.

A central hole 17 and lateral holes 18 and 19 are formed in the fixed shaft 10. The central hole 17 is formed to be opened on the lower end face of the fixed shaft 10 and to extend along the central axis of the fixed shaft 10. The lateral holes 18 and 19 are formed in the fixed shaft 10 to communicate from the central hole 17 to the concave portions 13 and 15. In other words, the central hole 17 and the lateral hole 18 function as a passage to communicate from the lower end face of the fixed shaft 10 to the stator S in combination with each other. Similarly, the central hole 17 and the lateral hole 19 function as a passage for communicating from the lower end face of the fixed shaft 10 to an electromagnet 42 in combination with each other.

The conveying arm assembly 30 is constituted by a pulley 31, an arm 32 and the like. The pulley 31 is fixed to the upper end of the operating shaft 21, and the arm 32 is fixed to the upper end of the operating shaft 22. While one end portion of a belt 33 is wound around the pulley 31, other portion of the belt 33 is also wound around a pulley provided in the tip portion of the arm 32 which is not shown. When the rotation of the operating shaft 22 is controlled in a state in which the operating shaft 21 is fixed, the conveying arm assembly 30 is expanded or contracted. When both the operating shafts 21 and 22 are rotated at the same angular velocity in the same direction, the conveying arm assembly 30 is turned.

The resolver type position detector 40 is constituted by a permanent magnet 41, the electromagnet 42 and the like, and is provided between the fixed shaft 10 and the operating shafts 21 and 22. The resolver type position detector 40 functions as a rotation detecting portion capable of detecting the rotation of each of the operating shafts 21 and 22. The electromagnet 42 is accommodated in the annular concave portion 15 formed on the fixed shaft 10 in the same manner as the stator S. The concave portion 15 also has an opening closed with airtightness by a cylindrical separating wall member 16.

Figure 2A:
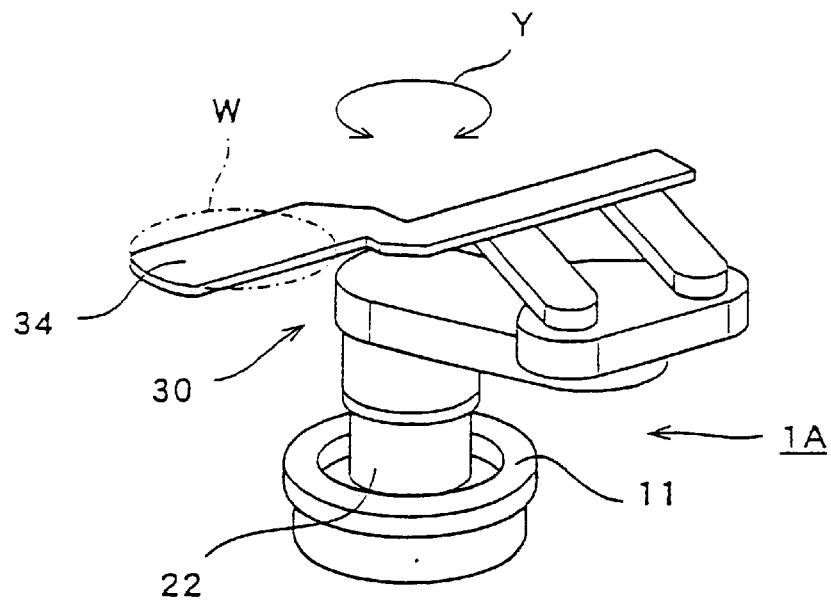
FIGS. 2a, 2b are views showing the appearance of the conveying device, FIG. 2a showing a state in which a conveying arm assembly is contracted and FIG. 2b showing a state in which the conveying arm assembly is expanded.
Figure 2B:
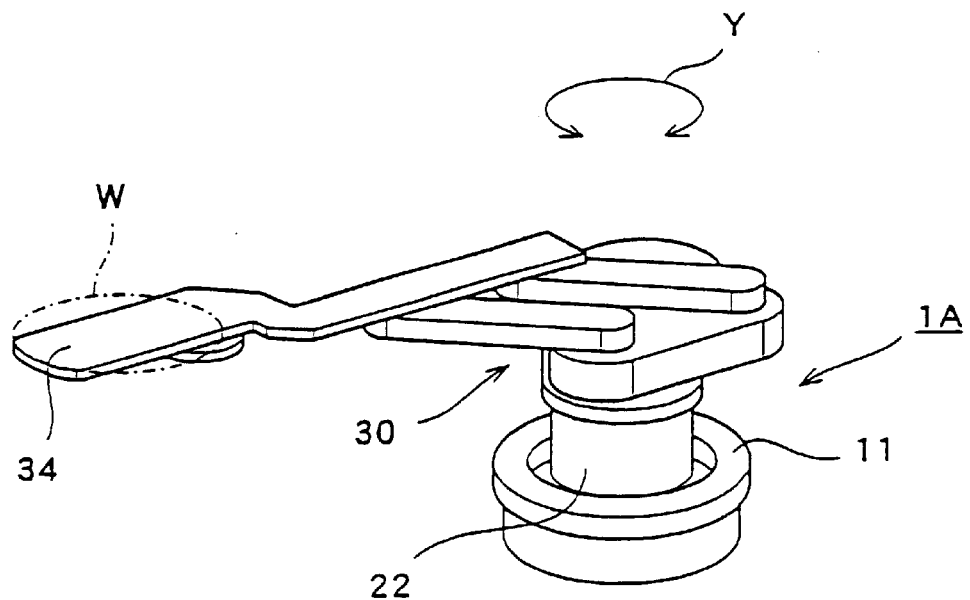

FIGS. 2a, 2b are views showing the appearance of the conveying device 1A, FIG. 2a showing a state in which the conveying arm assembly 30 is contracted and FIG. 2b showing a state in which the conveying arm assembly 30 is expanded. An arrow Y in the drawings indicates the direction of the turn of the conveying arm assembly 30. A work piece W such as a silicon wafer or the like is mounted on a work piece conveying portion 34 of the conveying arm assembly 30 and is moved in the vacuum chamber 50.

Referring to FIG. 1 again, both the operating shafts 21 and 22 have almost the same shapes in the conveying device 1A. Since the fixed shaft 10 is accommodated in the hollow portions of the operating shafts 21 and 22, their inside diameters are comparatively increased and their outside diameters are correspondingly increased. However, the operating shafts 21 and 22 have the hollow structures and their cross-sectional shapes are annular. Therefore, it is possible to make the operating shafts 21 and 22 light even if the outside diameters are large. Moreover, since the outside diameters are large, moduli of section can be increased and torsional rigidities can also be enhanced. In addition, moduli of section and torsional rigidities of both of operating shafts 21 and 22 can be increased in the conveying device 1A.

Furthermore, it is not necessary to cause one of the operating shafts to penetrate the other operating shaft differently from a conventional conveying device. Therefore, the operating shafts 21 and 22 can be comparatively shortened. Consequently, the torsional rigidities of the operating shafts 21 and 22 can also be enhanced.

Moreover, since the bearing B holding the operating shafts 21 and 22 is attached to the fixed shaft 10, their run-out can be reduced.

In general, a position where the rotor is provided serves as a point of action of the motor. In an outer rotor type motor such as the motor M of the conveying device 1A, it is able to cause the rotor to be more distant from the center of rotation than in an inner rotor type motor. Accordingly, a great torque can easily be obtained. More specifically, even if the height of the rotor R (the length of the rotor R in the axial direction of the operating shafts 21 and 22) is reduced, a necessary torque can be obtained. Therefore, the operating shafts 21 and 22 can be shortened, thereby contributing to an enhancement in the torsional rigidities of the operating shafts 21 and 22.

Generally, if a resonance is generated on the operating shaft, the precision of positioning control of the conveying arm assembly is adversely affected. In the conveying device 1A, however, the torsional rigidities of the operating shafts 21 and 22 can be increased as described above, and the resonance frequencies of the operating shafts 21 and 22 can easily be increased more than a frequency included in the driving signal of the motor M. Consequently, the resonance of each of the operating shafts 21 and 22 can be prevented and the precision of the positioning control of the conveying arm assembly 30 can be enhanced.

Moreover, the length and cross-sectional shape of each of the operating shafts 21 and 22 can be formed almost identically with each other. Therefore, the torsional rigidity of each of the operating shafts 21 and 22 can also be set almost equal with each other.

Thus, the weight of each of the operating shafts 21 and 22 can be reduced and the torsional rigidity of each of the operating shafts 21 and 22 can be enhanced. Consequently, the conveying arm assembly 30 can be quickly set in a conveying position so that it can be rapidly stabilized in the conveying position. By setting the torsional rigidities of the operating shafts 21 and 22 equal to each other, moreover, synchronous driving can be performed at a high speed.

Furthermore, although the diameter of the operating shaft is larger than in the conventional conveying device, the dimension of the conveying device 1A is not increased because the motor M is of the outer rotor type.

As described above, moreover, the conveying device 1A has the motor M of the outer rotor type and it is possible to cause the rotor to be more distant from the center of rotation in such a motor. Therefore, the operating shafts 21 and 22 can be shortened. As a result, the height of the conveying device 1A can be reduced. Consequently, even if the flange portion 11 to be fixed to the wall portion 51 of the vacuum chamber 50 is formed in the vicinity of the lower end of the fixed shaft 10 as in the conveying device 1A shown in FIG. 1, the height of projection of the conveying arm assembly 30 into the vacuum chamber 50 is sufficiently small. Accordingly, the driving space of the conveying arm assembly 30 can be fully kept. Such a structure is advantageous to the case where an outward projection from the wall portion 51 of the vacuum chamber 50 should be reduced as much as possible.

Moreover, the stator accommodating space formed by closing the opening of the concave portion 13 with airtightness by means of the separating wall member 14 is isolated from the outer peripheral face of the fixed shaft 10. The stator S accommodated in this space is cut off from an environment in which the operating shafts 21 and 22 and the conveying arm assembly 30 are present, that is, the vacuum environment of the vacuum chamber 50. Accordingly, the vacuum environment of the vacuum chamber 50 is not deteriorated due to a dust generated on the stator S side or the like, and a gas does not leak into the vacuum chamber 50 from the stator S side.

Furthermore, a space on the periphery of the stator S and a space on the periphery of the electromagnet 42 communicate with the air through the lateral holes 18 and 19 and the central hole 17. Consequently, heat generated by the stator S and the electromagnet 42 is discharged to the air. Although the concave portions 13 and 15 communicate with the air due to the central hole 17 and the lateral holes 18 and 19, the vacuum environment of the vacuum chamber 50 is isolated from the air because the openings of the concave portions 13 and 15 are closed with airtightness by the separating wall members 14 and 16. C in the drawing denotes an electric wire which serves to supply power to the stator S and the electromagnet 42 and is distributed to the stator S and the electromagnet 42 through the central hole 17 and the lateral holes 18 and 19. Thus, the passage formed by the central hole 17 and the lateral holes 18 and 19 can also be utilized for the wiring to the stator S and the electromagnet 42.

Figure 3:
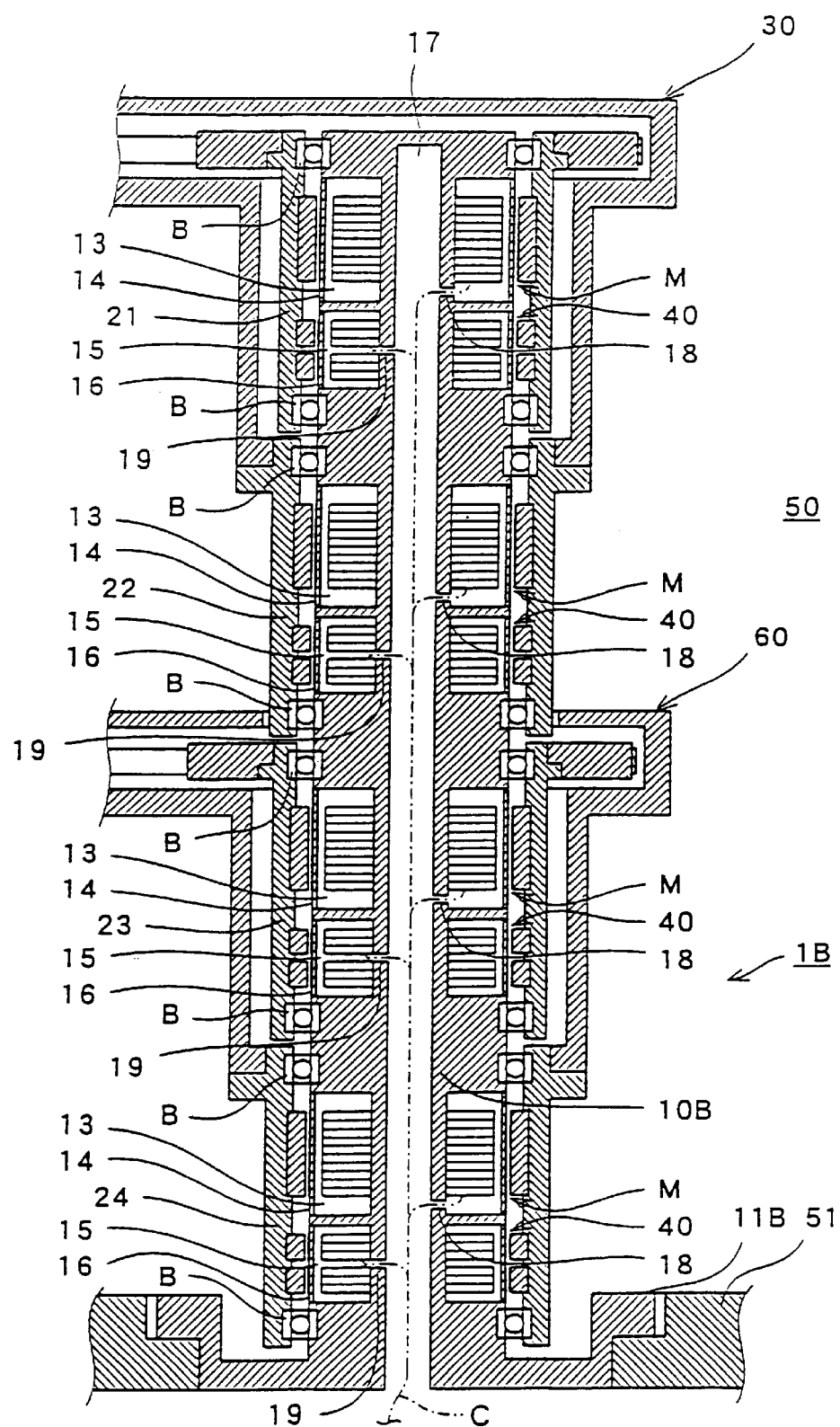
FIG. 3 is a longitudinal sectional view showing a conveying device according to a second embodiment of the present invention.

FIG. 3 is a longitudinal sectional view showing a conveying device 1B according to a second embodiment of the present invention. The conveying device 1B has a longer fixed shaft 10B than in the conveying device 1A shown in FIG. 1, and comprises two sets of operating shafts 21, 22, 23 and 24 and two conveying arm assemblies 30 and 60 whose operations are controlled by the operating shafts 21, 22, 23 and 24.

The four operating shafts 21, 22, 23 and 24 have almost the same shapes, and are attached coaxially with the fixed shaft 10B to accommodate the fixed shaft 10B in their hollow spaces and to be arranged in multistages in the axial direction of the fixed shaft 10B.

The conveying arm assembly 30 is attached to the upper ends of the operating shafts 21 and 22, and the conveying arm assembly 60 is attached to the upper ends of the operating shafts 23 and 24. The expansion, contraction and turn of the conveying arm assembly 30 is controlled by the control of the rotation of the operating shafts 21 and 22, and that of the conveying arm assembly 60 is controlled by the control of the rotation of the operating shafts 23 and 24.

A motor M, the conveying arm assemblies 30 and 60 and a resolver type position detector 40 of the conveying device 1B have the same structures as those in the conveying device 1A shown in FIG. 1.

Figure 4C:
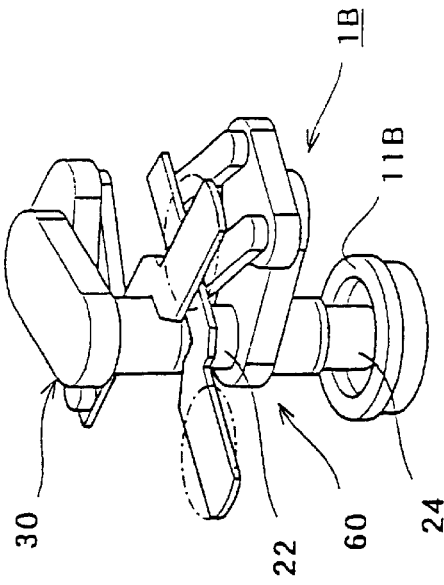
FIGS. 4a, 4b, 4c, 4d are views showing the appearance of the conveying device of FIG. 3, FIG. 4a showing a state in which both conveying arm assemblies are contracted, FIG. 4b showing a state in which one of the conveying arm assemblies is expanded from the state of FIG. 4a, FIG. 4c showing a state in which one of the conveying arm assemblies is turned from the state of FIG. 4a, and FIG. 4d showing a state in which one of the conveying arm assemblies is expanded from the state of FIG. 4c.
Figure 4D:
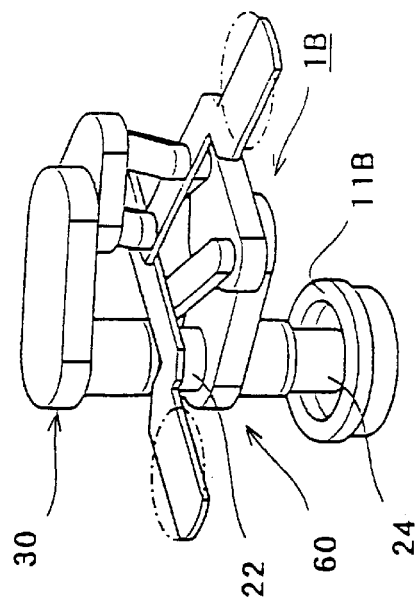
Figure 4A:
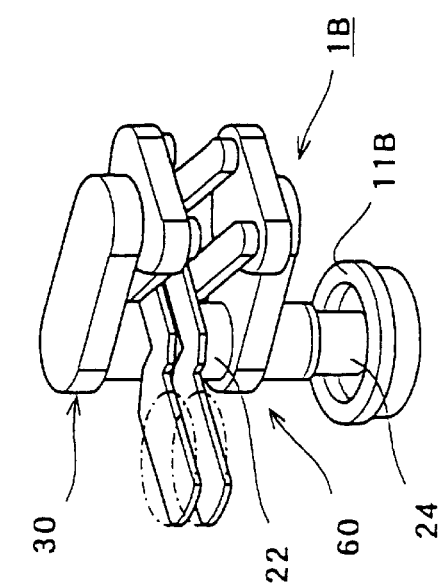
Figure 4B:
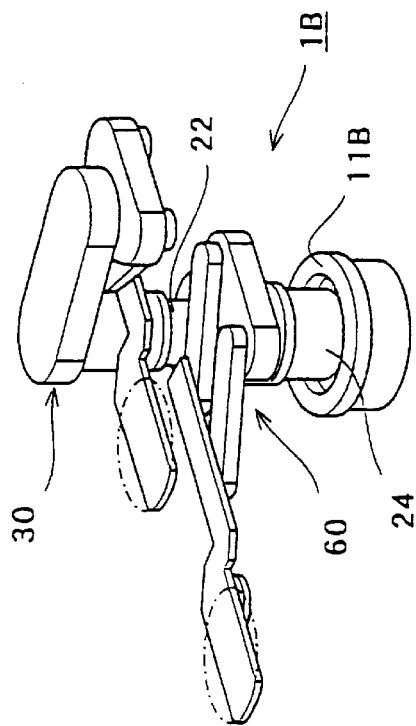

FIGS. 4a, 4b, 4c, 4d are views showing the appearance of the conveying device 1B, FIG. 4a showing a state in which both the conveying arm assemblies 30 and 60 are contracted, FIG. 4b showing a state in which the conveying arm assembly 60 is expanded from the state of FIG. 4a, FIG. 4c showing a state in which the conveying arm assembly 30 is turned from the state of FIG. 4a, and FIG. 4d showing a state in which the conveying arm assembly 30 is expanded from the state of FIG. 4c.

Referring to FIG. 3 again, the conveying device 1B comprises four operating shafts 21, 22, 23 and 24. All the operating shafts 21, 22, 23 and 24 have almost the same shapes. For all the four operating shafts 21, 22, 23 and 24, weights can be reduced and torsional rigidities can be enhanced in the same manner as in the conveying device 1A shown in FIG. 1. Moreover, the torsional rigidities of the four operating shafts 21, 22, 23 and 24 can be set identically. Also in such a structure that the conveying arm assembly is thus attached to each set of operating shafts, synchronous driving can be performed at a high speed and a work for setting the conveying arm assembly in the conveying position can be rapidly carried out.

As compared with the conveying device 1A shown in FIG. 1, it is apparent that the conveying device 1B has a multishaft structure having plural sets of operating shafts and the shape and dimension of a flange portion 11B is identical to that of the flange portion 11 of the conveying device 1A. This is caused by such a structure that the operating shafts 21, 22, 23 and 24 are not provided coaxially but are provided in multistages to be piled up in the axial direction of the fixed shaft 10B. Thus, whether the conveying device controls the operation of only one conveying arm assembly or the operation of a plurality of conveying arm assemblies, the dimension of an attaching portion can be set equal and the size of an attaching hole of a wall portion of a vacuum chamber does not need to be changed.

Moreover, all the operating shafts 21, 22, 23 and 24 are directly held by bearings B attached to the fixed shaft 10B respectively. Therefore, run-out due to the precision of the bearing B is not accumulated.

Figure 5:
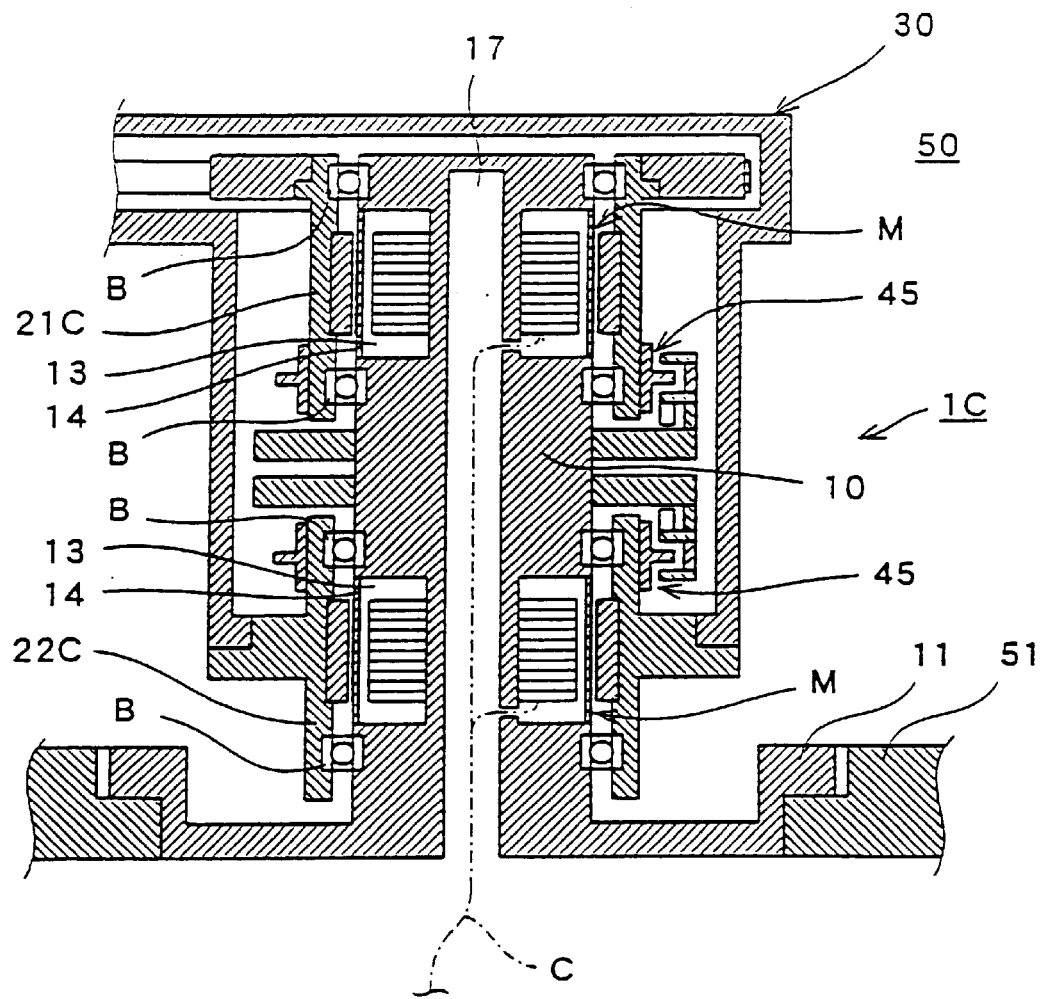
FIG. 5 is a longitudinal sectional view showing a conveying device according to a third embodiment of the present invention.

FIG. 5 is a longitudinal sectional view showing a conveying device 1C according to a third embodiment of the present invention. The conveying device 1C is different from the conveying device 1A shown in FIG. 1 in that a rotation detecting portion capable of detecting the rotation of operating shafts 21C and 22C is constituted by an optical encoder 45. Other structures are almost the same as in the conveying device 1A shown in FIG. 1. Thus, not only the resolver type position detector but also the optical encoder can be used as the rotation detecting portion.

Figure 6:
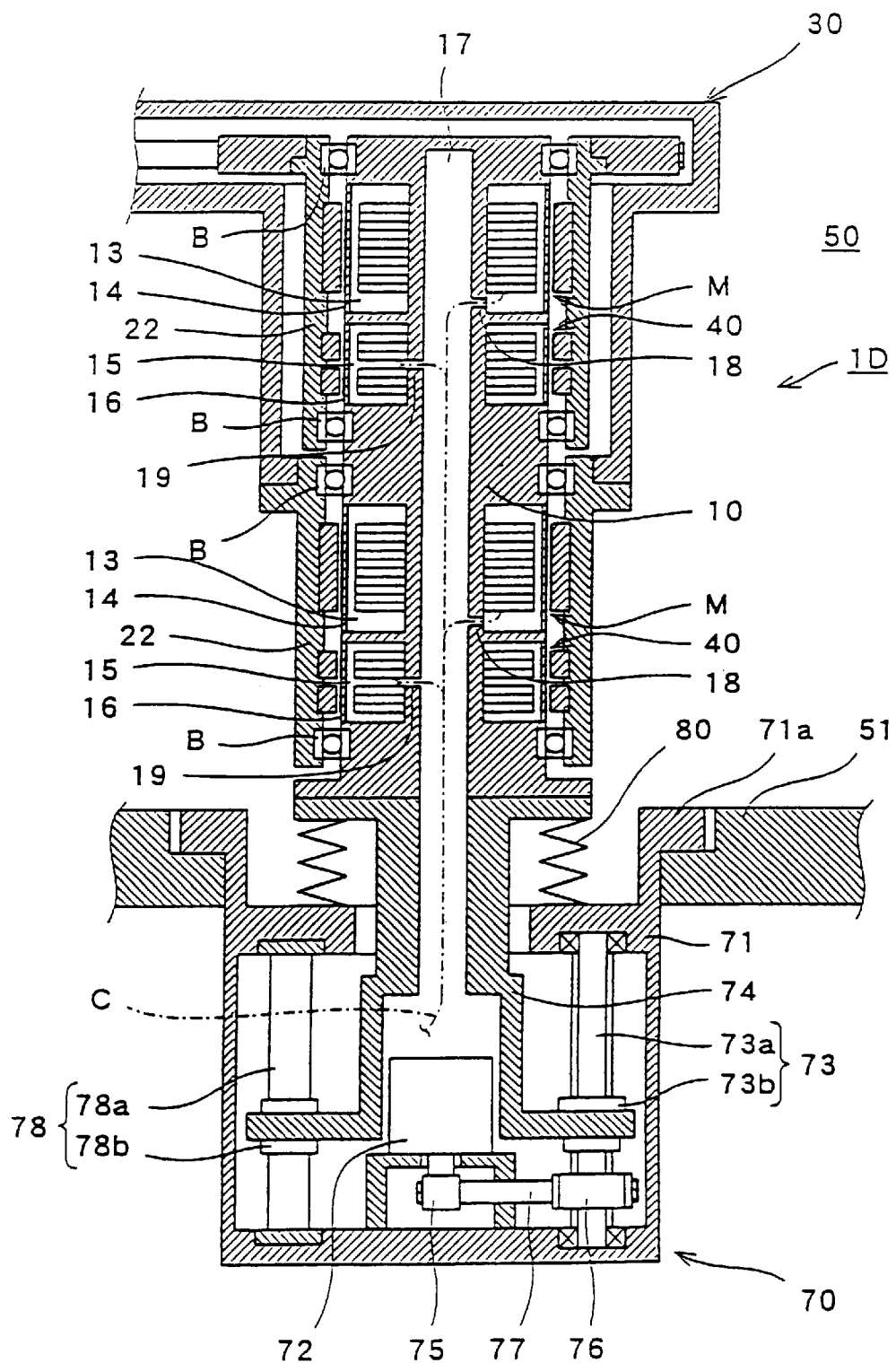
FIG. 6 is a longitudinal sectional view showing a conveying device according to a fourth embodiment of the present invention.

FIG. 6 is a longitudinal sectional view showing a conveying device 1D according to a fourth embodiment of the present invention. The conveying device 1D is different from the conveying device 1A shown in FIG. 1 in that it comprises a lift mechanism 70. The lift mechanism 70 is mainly constituted by a housing 71, a motor 72, a ball screw mechanism 73 and a support member 74. The ball screw mechanism 73 is constituted by a screw portion 73a and a nut portion 73b. A flange portion 71a is formed on the outer periphery of the housing 71. The flange portion 71a is fixed to an attaching hole formed on a wall portion 51 of a vacuum chamber 50. The motor 72 is accommodated in the housing 71. When the motor 72 is rotated, the screw portion 73a coupled to the motor 72 through pulleys 75 and 76 and a belt 77 is rotated. The nut portion 73b screwed to the screw portion 73a is fixed to the support member 74. Accordingly, the support member 74 can be brought up and down by controlling the rotation of the motor 72. The upper end of the support member 74 supports the lower end of the fixed shaft 10. When the support member 74 is brought up and down, the conveying arm assembly 30 is also brought up and down. The reference numeral 78 denotes a guide mechanism constituted by a guide column 78a fixed to the housing 71 and a sliding portion 78b fixed to the support member 74 for causing the guide column 78a to penetrate.

While the fixed shaft 10 is attached to the wall portion 51 of the vacuum chamber 50 more directly through only the flange portion 11 in the conveying device 1A shown in FIG. 1, a fixed shaft 10 is indirectly attached to a wall portion 51 of a vacuum chamber 50 through the lift mechanism 70 in the conveying device 1D of FIG. 6. A bellows 80 which is a flexible seal member is provided between the fixed shaft 10 and the wall portion 51 of the vacuum chamber 50. The vacuum environment of the vacuum chamber 50 is kept by the bellows 80, and the conveying arm assembly 30 is put in the vacuum environment. Not only the bellows 80 but also the housing 71 and the support member 74 are provided between the fixed shaft 10 and the wall portion 51 of the vacuum chamber 50. All these members function to maintain the vacuum environment of the vacuum chamber 50.

Figure 7A:
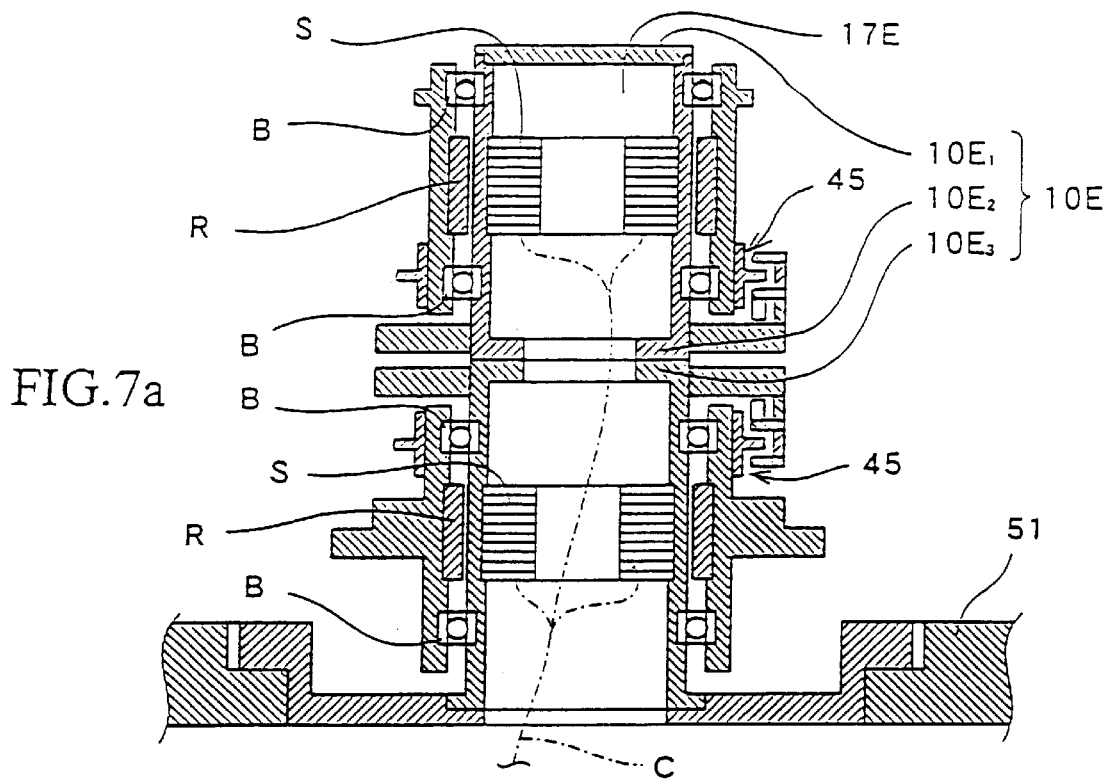
FIGS. 7a, 7b are a longitudinal sectional views of a fixed shaft illustrating various examples of a structure for forming a stator accommodating space, FIG. 7a showing an example in which the internal space of the fixed shaft constituted by a cylinder member and a cover member acts as the stator accommodating space and FIG. 7b showing an example in which a space surrounded by the inner peripheral face of the cylinder member and the outer peripheral face of a solid shaft and the like acts as the stator accommodating space.
Figure 7B:
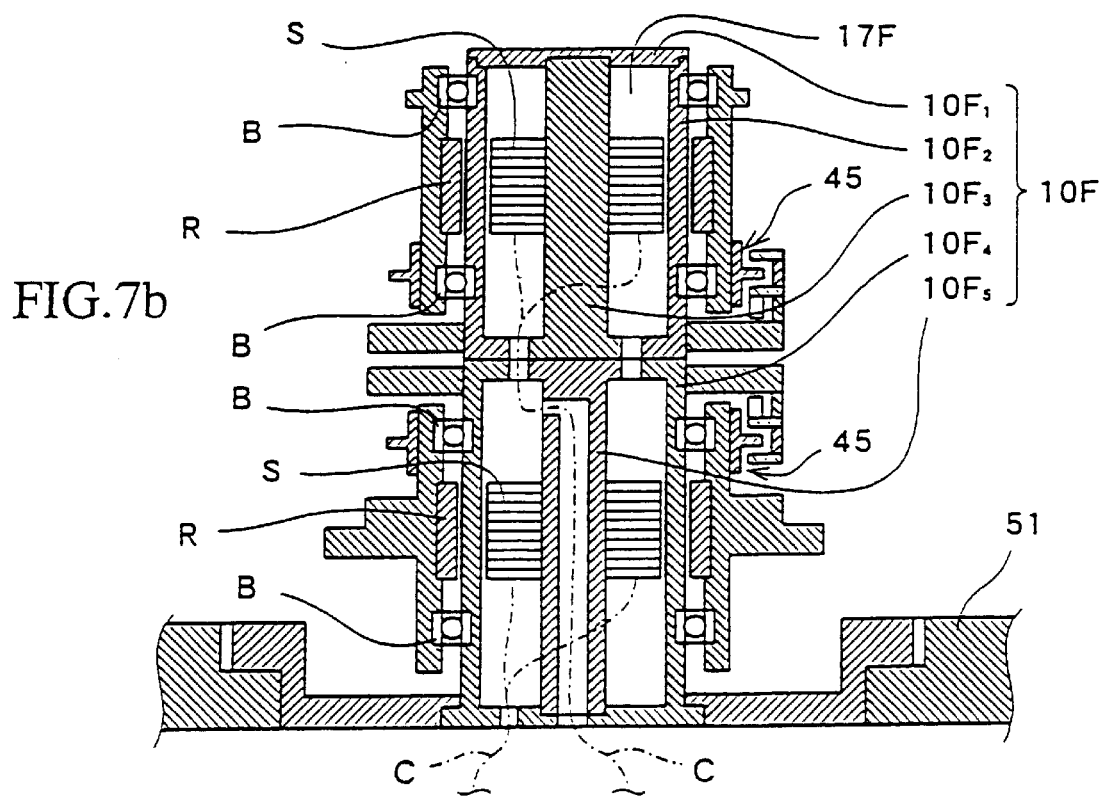

Various embodiments of the conveying device according to the present invention have been described with reference to FIGS. 1 to 6. In the above-mentioned embodiments, the concave portion is formed to be opened on the outer peripheral face of the fixed shaft, and the stator accommodating space is formed by closing the opening of the concave portion with airtightness by means of the wall separating member. The passage for communicating from the end face of the fixed shaft to the stator is formed by the central hole and the lateral holes which are formed in the fixed shaft. However, the stator accommodating space can have various structures other than the above-mentioned structures. FIGS. 7a, 7b show an example of structures other than the above-mentioned structures for forming the stator accommodating space. FIG. 7a shows a fixed shaft 10E formed by a cover member 10E1 and two cylinder members 10E2 and 10E3. The cylinder members 10E2 and 10E3 are vertically connected such that their inner portions communicate with each other. An opening on the upper end of the cylinder member 10E2 is closed by the cover member 10E1. A stator S is fixed to the inner peripheral faces of each of the cylinder members 10E2 and 10E3. In this case, an inner space 17E of the fixed shaft 10E functions as a stator accommodating space. Moreover, since the space 17E communicates with the air through an opening on the lower end of the fixed shaft 10E, it also functions as a passage for the heat discharge and wiring of the stator S. FIG. 7b shows a fixed shaft 10F constituted by a cover member 10F1, a cylinder member 10F2, a solid shaft 10F3, a cylinder member 10F4 and a hollow shaft 10F5. The cylinder members 10F2 and 10F4 are vertically connected such that their inner portions communicate with each other, and an opening provided on the upper end of the cylinder member 10F2 is closed by the cover member 10F1. Moreover, the solid shaft 10F3 and the hollow shaft 10F5 are vertically connected and fixed such that they are interposed between the cover member 10F1 and the bottom of the cylinder member 10F4 and are situated on the inside of the cylinder members 10F2 and 10F4. The hollow space of the hollow shaft 10F5 communicates with the inner space of the cylinder member 10F4 through a hole opened on the outside face of the hollow shaft 10F5. Furthermore, the hollow space of the hollow shaft 10F5 communicates with an air space of the outside through a hole formed in the center of the bottom of the cylinder member 10F4. The stator S is fixed to the outer peripheral faces of each of the solid shaft 10F3 and the hollow shaft 10F5. In this case, a space 17F surrounded by the inner peripheral faces of the cylinder members 10F2 and 10F4 and the outer peripheral faces of the solid shaft 10F3 and the hollow shaft 10F5 acts as a stator accommodating space. Since the space 17F communicates with the air through the hollow space of the hollow shaft 10F5 and the hole provided on the bottom of the cylinder member 10F4, that is, the opening formed on the lower end of the fixed shaft 10F, it also functions as a passage for the heat discharge and wiring of the stator S.

Figure 8A:
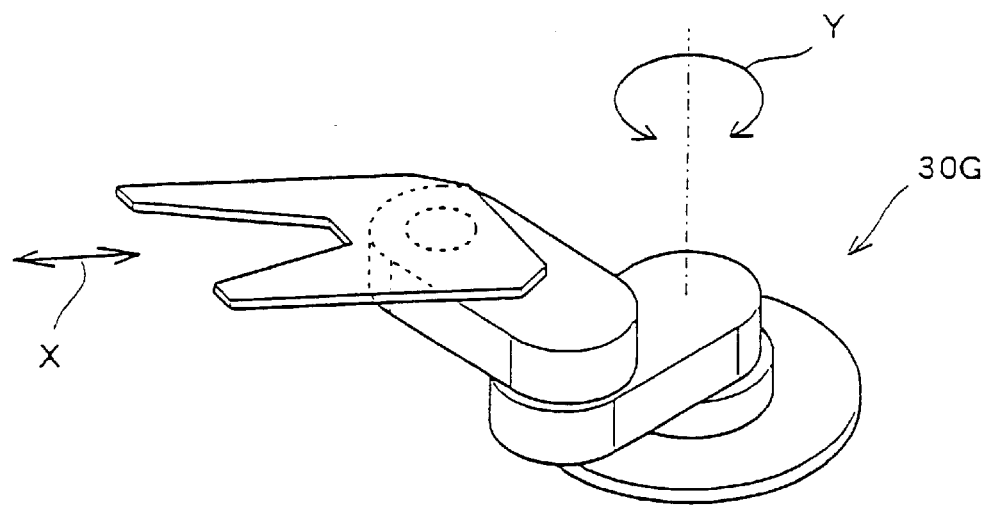
FIGS. 8a, 8b are views showing the appearance of a respective alternative conveying arm assembly according to various examples, FIG. 8a showing a scalar type conveying arm assembly and FIG. 8b showing a frog-leg type conveying arm assembly.
Figure 8B:
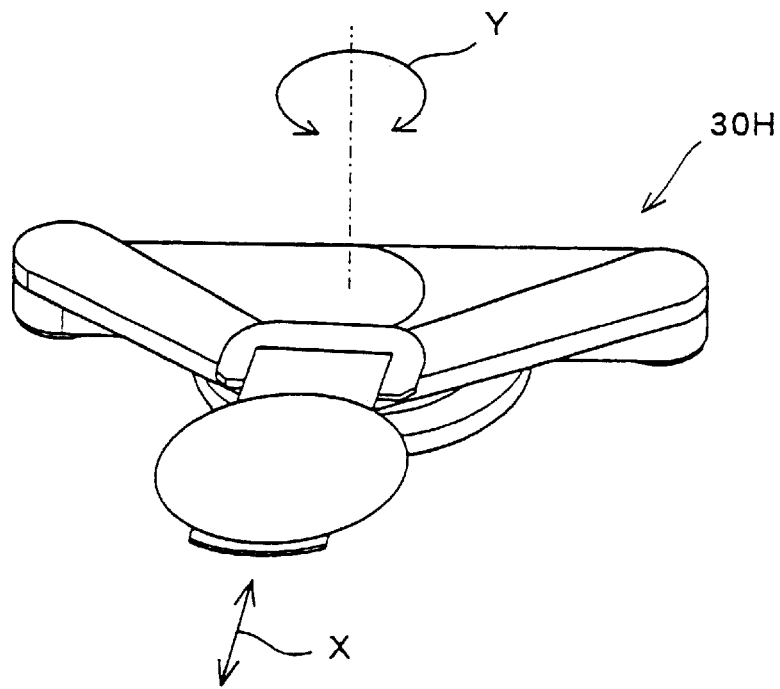
Figure 9:
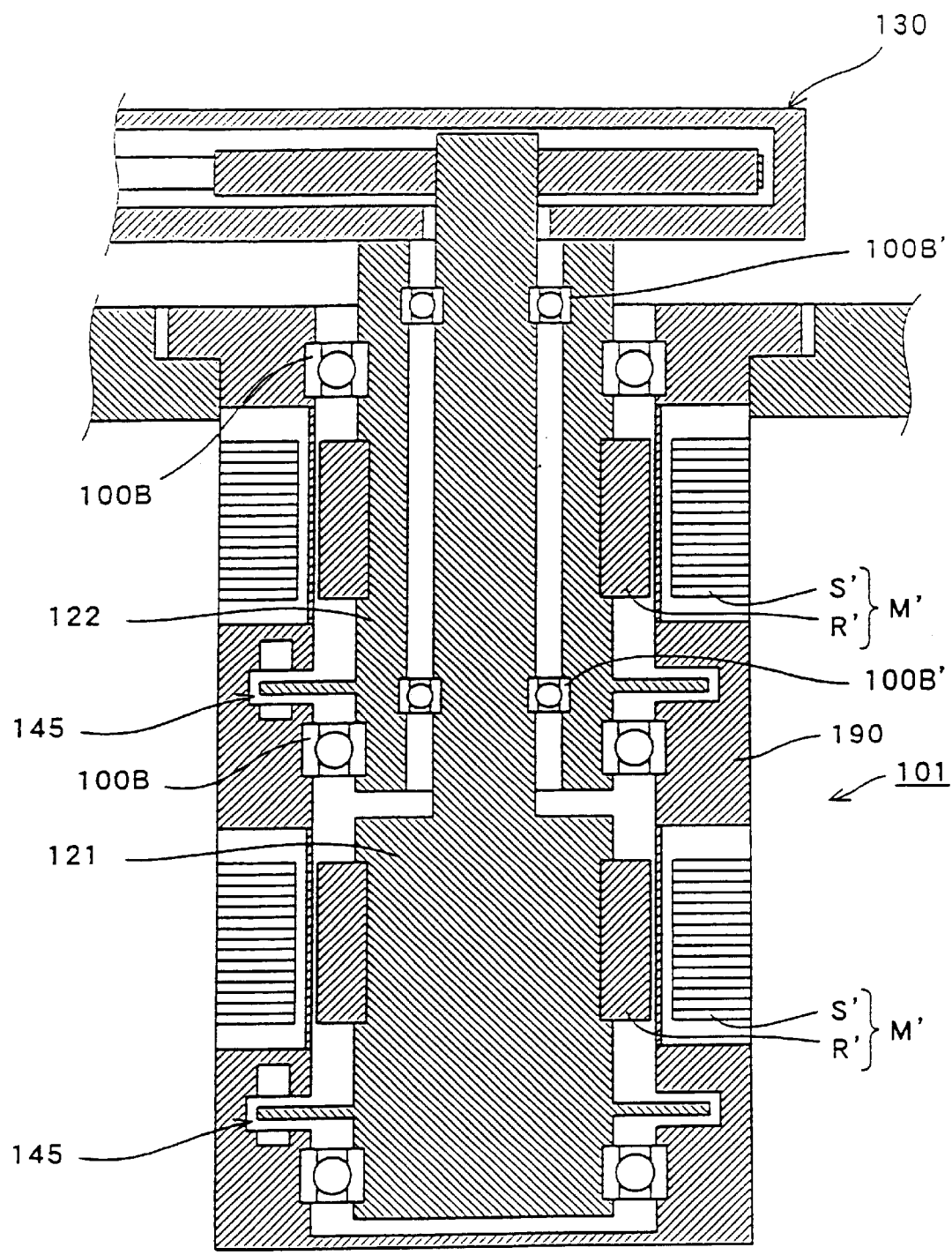
FIG. 9 is a longitudinal sectional view showing a conveying device according to the prior art.
Figure 10:
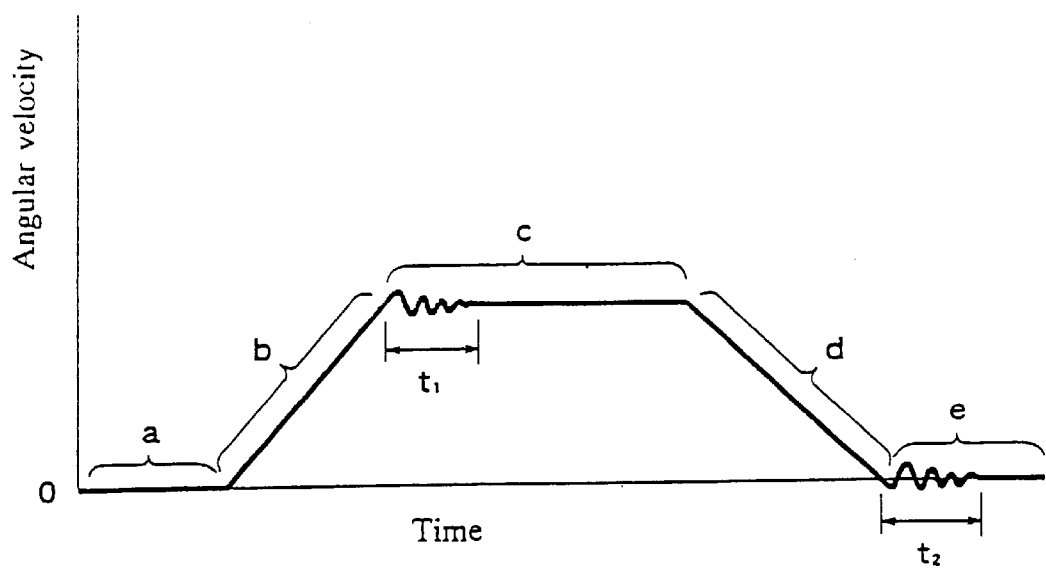
FIG. 10 is a chart showing a process of controlling the rotation of a shaft.

Moreover, the conveying arm assembly according to each of the above-mentioned embodiments shown in FIGS. 2a, 2b, 4a, 4b, 4c and 4d are particularly an example of the conveying arm assembly for constituting the conveying device according to the present invention, and conveying arm assemblies having various configurations can be applied. FIGS. 8a, 8b show another example of the conveying arm assembly. FIG. 8a shows a scalar type conveying arm assembly 30G. Control for expansion, contraction and turn of the conveying arm assembly 30G is performed by two operating shafts. More specifically, the conveying arm assembly 30G is expanded or contracted when one of the two operating shafts is fixed and the other operating shaft is rotated, and it is turned when both the operating shafts are rotated at the same rotating speed in the same direction. In the drawing, an arrow X indicates the direction of the expansion and contraction of the conveying arm assembly 30G and an arrow Y indicates the direction of the turn of the conveying arm assembly 30G. FIG. 8b shows a frog-leg type conveying arm assembly 30H. Control for expansion, contraction and turn of the conveying arm assembly 30H is performed by two operating shafts. The conveying arm assembly 30H is expanded or contracted when both the operating shafts are rotated in opposite directions at the same time, and it is turned when both the operating shafts are rotated at the same rotating speed in the same direction. In the drawing, an arrow X indicates the direction of the expansion and contraction of the conveying arm assembly 30H and an arrow Y indicates the direction of the turn of the conveying arm assembly 30H.

Figure 11:
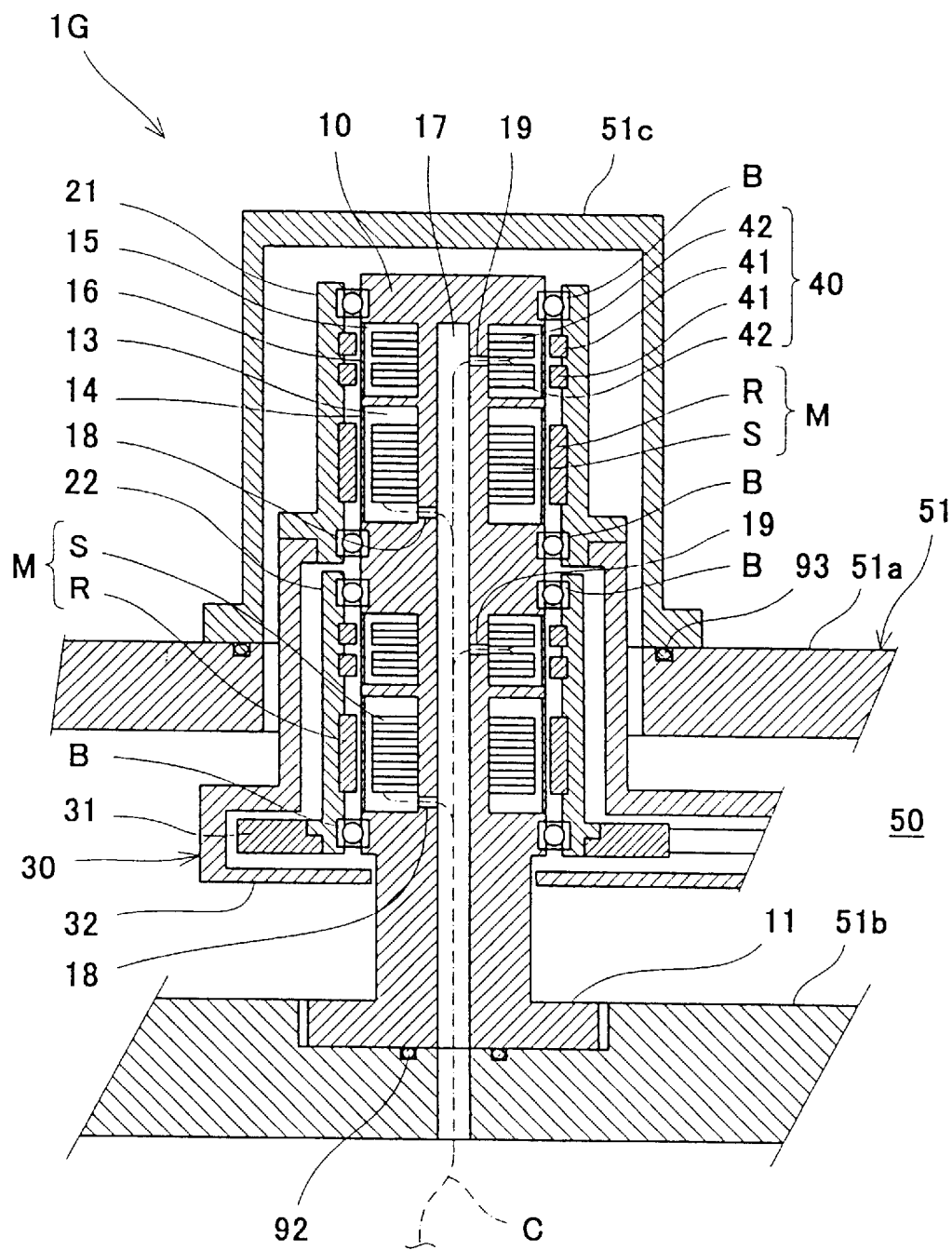
FIG. 11 is a longitudinal sectional view showing a conveying device according to a fifth embodiment of the present invention.

FIG. 11 is a longitudinal sectional view showing a conveying device 1G according to a fifth embodiment of the present invention. The conveying device 1G is different from the conveying device 1A of FIG. 1 in that the conveying arm assembly 30 is attached to an end portion of the operating shaft 22 situated closer to a fixed end of the fixed shaft 10 that is fixed to the lower wall portion 51b of the vacuum chamber 50, the end portion being situated closer to the fixed end of the fixed shaft. That is, the conveying arm assembly 30 is attached to a lower end portion of the operating shaft 22 situated on a lower side. The pulley 31 of the conveying arm assembly 30 is fixed to the operating shaft 22 and the arm 32 of the conveying arm assembly 30 is connected to the operating shaft 21 situated on an upper side. The positional relationship between the motor M and the resolver type position detector 40 for each of the operating shafts 21 and 22 in a vertical direction is reversed as compared with that of the conveying device 1A of FIG. 1.

The lower wall portion 51b of the vacuum camber 50 is provided as close to the conveying arm assembly 30 as possible. A convex portion 51c is formed on an upper wall portion 51a of the vacuum chamber 50 to accommodate an upper half portion of the conveying device 1G, and the other portion of the upper wall portion 51a is provided as close to the conveying arm assembly 30 extending horizontally as possible. Reference numbers 92 and 93 denote seal members for sealing the vacuum chamber 50 to isolate the inside from the outside.

On the other hand, in the conveying device 1A of FIG. 1, the conveying arm assembly 30 is attached to the upper end portion of the operating shaft 21 situated on the upper side. In this case, when the flange portion fitted into the attaching hole formed in the lower wall portion of the vacuum chamber 50 is formed as being concave so as to cover the peripheral portion of the portion to which the fixed shaft is attached and the upper and lower wall portions are made closer to the conveying arm assembly, the inner space of the vacuum chamber can be made smaller. Consequently, the vacuum chamber can be made compact.

However, in general, the lower wall portion of the vacuum chamber 50 is positioned to have a predetermined height from the installation floor and other devices necessary for the semiconductor fabricating device, for example, a vacuum pump, various gas supply devices, a high frequency power matching device and the like are placed in the space formed between the lower wall portion of the vacuum chamber 50 and the installation floor. Nevertheless, in the conveying device 1A of FIG. 1, because a part of this space is occupied by the flange portion, this space is not efficiently utilized.

On the other hand, in the conveying device 1G, when the upper wall portion of the vacuum chamber is made closer to the conveying arm assembly except the periphery of the portion of the conveying device where the motor is provided, the inner space of the vacuum chamber can be made smaller and the space formed between the lower wall portion of the vacuum chamber and the installation floor is efficiently utilized because a part of conveying device does not exist in this space. In brief, since many devices necessary for the semiconductor fabricating device can be accommodated in a smaller installation area, the semiconductor fabricating device including vacuum chamber as well as the vacuum chamber can be made compact.

In this case, moreover, although a portion of the upper wall portion of the vacuum chamber 50 that covers the portion of the conveying device where the motor is provided is protruded upward, this configuration is convenient because an empty space is formed above the vacuum chamber 50.

Further, since the concave portion 13 is formed on the outer peripheral face of the fixed shaft 10 to accommodate the stator S therein, a cylindrical portion having a large thickness and extending over the whole length of the fixed shaft 10 is present in a central portion of the fixed shaft 10. For this reason, the weight of the conveying device 1G can be satisfactorily supported. Therefore, the strength of the conveying device 1G can be ensured. This effect is obtained in the conveying devices 1A–1D according to the first to fourth embodiments mentioned previously.

Figure 12A:
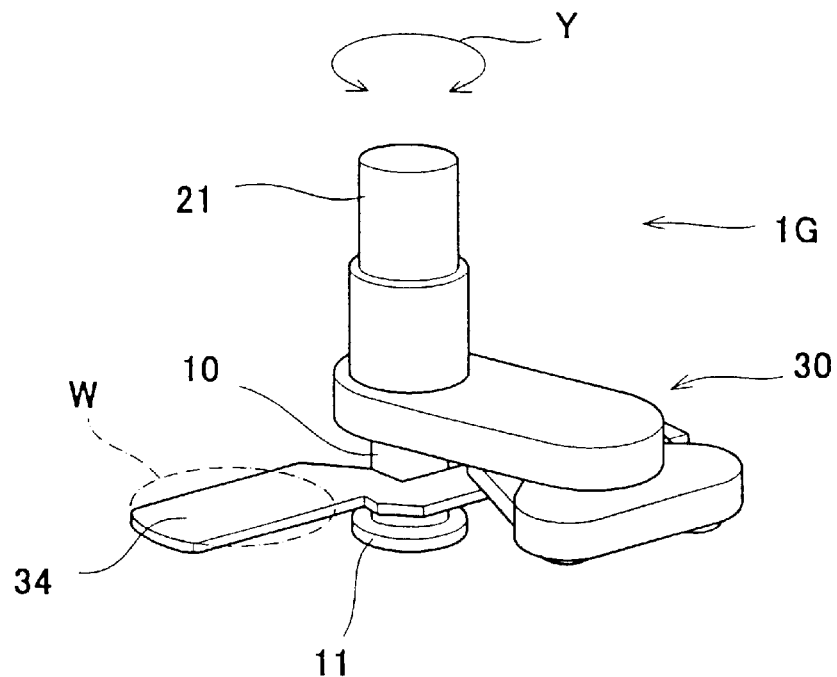
Figure 12B:
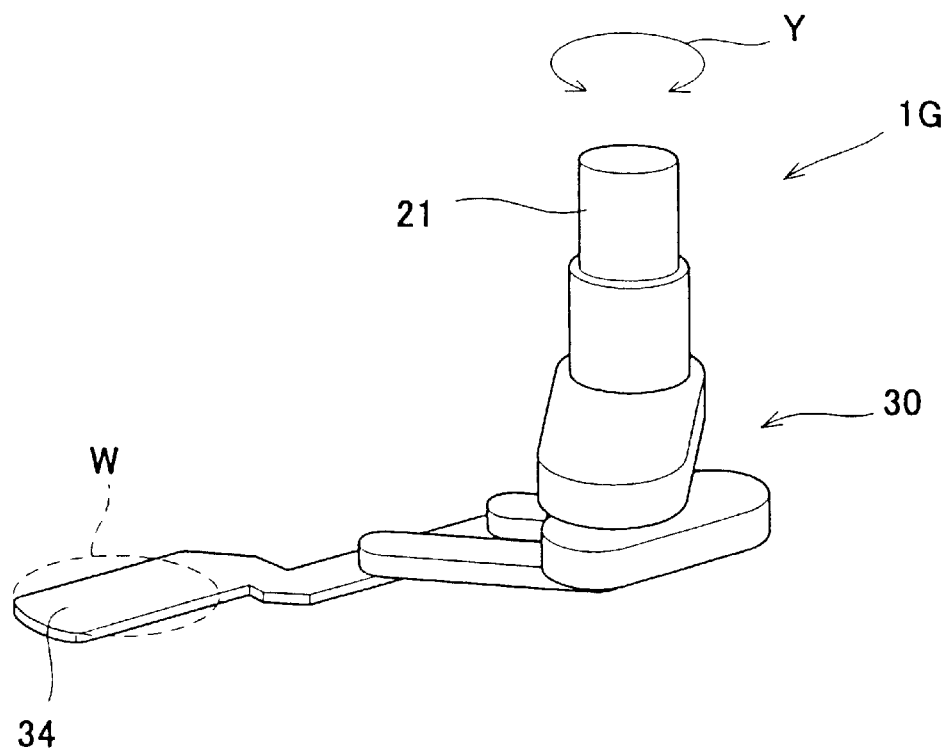

FIGS. 12a, 12b are views showing the appearance of the conveying device 1G, wherein FIG. 12a shows a state in which the conveying arm assembly 30 is contracted and FIG. 12b shows a state in which the conveying arm assembly 30 is expanded.

Figure 13:
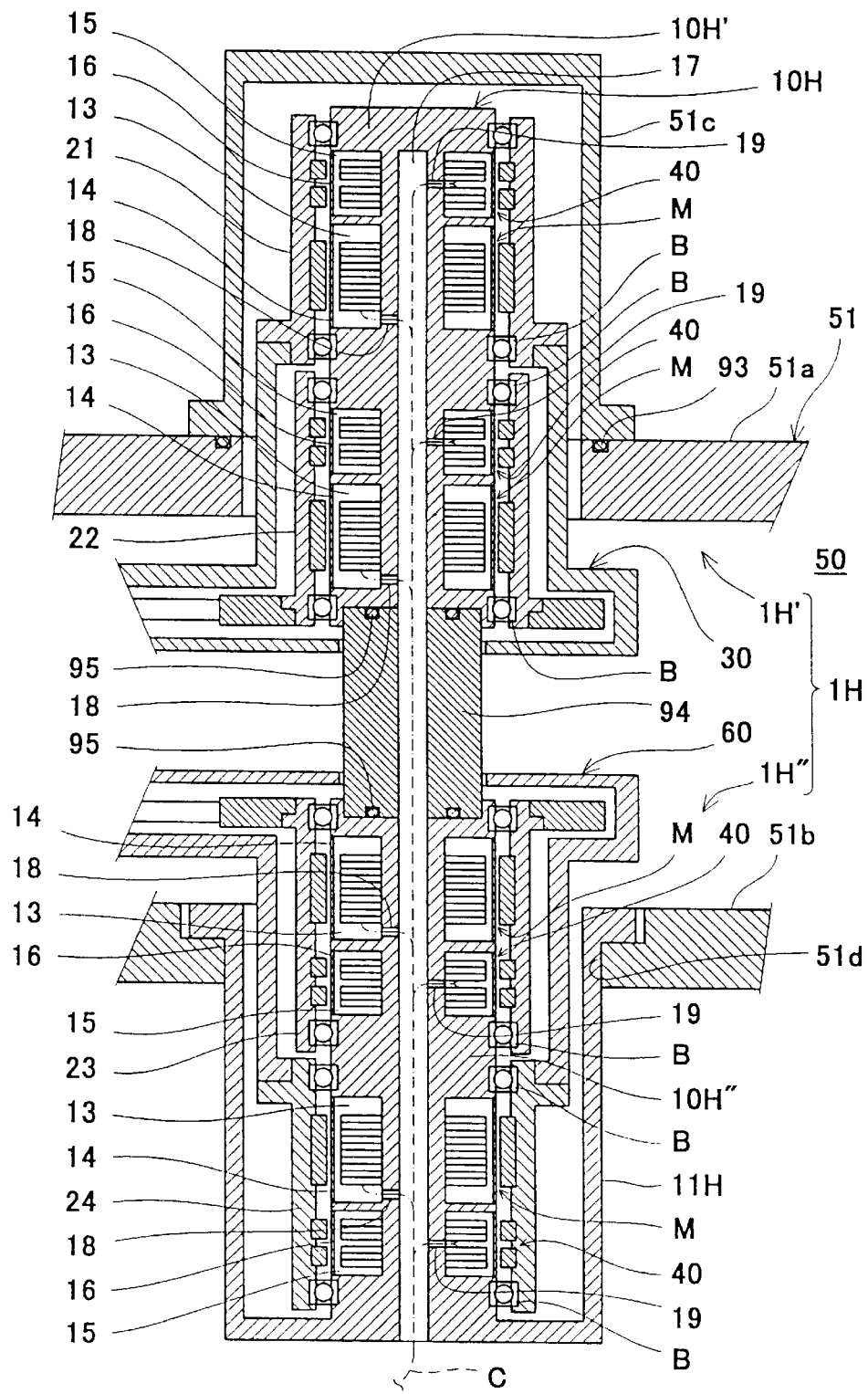
FIG. 13 is a longitudinal sectional view showing a conveying device according to a sixth embodiment of the present invention.

FIG. 13 is a longitudinal sectional view showing a conveying device 1H according to a sixth embodiment of the present invention. The conveying device 1H is different from the conveying device 1B of FIG. 3 in that two conveying arm assemblies 30 and 60 are attached to end portions of the operating shafts 22 and 23, respectively, the end portions being adjacent to each other and the operating shafts 22 and 23 belonging to different sets and situated adjacently to each other among two sets of operating shafts 21, 22 and 23, 24. That is, the conveying arm assembly 30 situated on an upper side is attached to a lower end portion of the operating shaft 22 corresponding to a lower shaft of the set of operating shafts 21, 22 situated on the upper side.

A fixed shaft 10H is constituted by a fixed shaft portion 10H' for the set of operating shafts 21, 22 situated on the upper side, a fixed shaft portion 10H" for the set of operating shafts 23, 24 situated on the lower side, and a connecting portion 94 connecting the fixed shaft portions 10H' and 10H". More specifically, in this conveying device 1H, a first conveying unit 1H' constituted by the fixed shaft portion 10H', the operating shafts 21, 22, and the conveying arm assembly 30 is connected to a second conveying unit 1H" constituted by the fixed shaft portion 10H", the operating shafts 23, 24, and the conveying arm assembly 60 by means of the connecting portion 94. Reference number 95 denotes a seal member for sealing the vacuum chamber 50 to isolate the inside of the vacuum chamber 50 from a passage 17.

The convex portion 51c is formed on the upper wall portion 51a of the vacuum chamber 50 to accommodate an upper half portion of the first conveying unit 1H', and the other portion of the upper wall portion 51a is provided as close to the conveying arm assembly 30 extending horizontally as possible. A cylindrical flange 11H is formed at a lower end portion of the fixed shaft portion 10H" of the second conveying unit 1H" to accommodate a lower half portion of the second conveying unit 1H". A hole 51d is formed in the lower wall portion 51b of the vacuum chamber 50 to fit the flange 11H thereinto, and the other portion of the lower wall portion 51b is provided as close to the conveying arm assembly 60 as possible. And, the flange 11H is fitted into the hole 51d and fixed to the lower wall portion 51b with airtightness (not shown).

Subsequently, comparison between so structured conveying device 1H and the conveying device 1B of FIG. 3 is described. In the conveying device 1B, the conveying arm assembly 30 is attached to the upper end portion of the operating shaft 21 corresponding to the upper shaft of the set of the operating shafts 21, 22 situated on the upper side, and it is therefore necessary to ensure an area where the conveying arm assembly 30 is movable, while in the conveying device 1H, the vacuum area ensured in the vacuum chamber can be made smaller than that of the conveying device 1B because the conveying arm assembly 30 is attached to the lower end portion of the operating shaft 22 situated on the lower side.

Therefore, as shown in FIG. 13, the upper wall portion 51a and the lower wall portion 51b of the vacuum chamber 50 can be made closer to the conveying arm assemblies 30 and 60, respectively, except the periphery of a portion of the conveying device 1H where the motor is provided. Thereby, the inner space of the vacuum chamber 50 can be made as small as possible. Consequently, it is possible to make the vacuum chamber as compact as possible.

In addition, in the conveying device 1H, since the first conveying unit 1H' and the second conveying unit 1H" are connected by means of the connecting portion 94, the conveying device 1H can be made by combining the conveying units 1H' and 1H". For this reason, maintenance cost can be reduced. Further, because the conveying device 1H can be separated into the conveying units 1H' and 1H", workability of maintenance such as replacement of the motor is improved as compared with the case where the fixed shaft 10H is integrally formed.

It is desirable to make the thickness of the connecting portion 94 as large as possible so as to support the weight of the conveying device itself and ensure the strength of the conveying device.

Furthermore, since the concave portion 13 is formed on the outer peripheral face of the fixed shaft 10H to accommodate the stator S therein, the cylindrical portion having a large thickness and extending over the whole length of the fixed shaft 10H is present in the central portion of the fixed shaft 10H. For this reason, the weight of the conveying device 1H itself can be satisfactorily supported. Consequently, the strength of the conveying device 1H can be ensured.

Moreover, while the fixed shaft 10H is constituted by the fixed shaft portions 10H' and 10H" and the connecting portion 94, it may be integrally formed.

FIGS. 14a–14c are views showing the appearance of the conveying device 1H, wherein FIG. 14a shows a state in which the conveying arm assemblies 30 and 60 are contracted, FIG. 14b shows a state in which the conveying arm assembly 60 is expanded from the state of FIG. 14a, FIG. 14c shows a state in which the conveying arm assembly 30 is turned from the state of FIG. 14a, and FIG. 14d shows a state in which the conveying arm assembly 30 is expanded from the state of FIG. 14c.

Moreover, in the above-mentioned embodiments, two operating shafts make one set. However, control for operating is performed by three or more operating shafts depending on the kind of the conveying arm assembly. In that case, operating shafts required for controlling the operation of the conveying arm assembly make one set.

The description has been given to the embodiment in which one set of operating shafts are provided and the conveying arm assembly is fixed to the upper portions of it and the embodiment in which two sets of operating shafts are provided and the conveying arm assembly is fixed to each set. However, it is also possible to provide much more operating shafts and conveying arm assemblies. Also in that case, the weight of the operating shaft can be reduced, and the torsional rigidity can be enhanced and set identically.

While the conveying device has been attached to the wall portion forming the bottom face of the vacuum chamber in the above-mentioned embodiments, the conveying device can also be attached to a wall portion forming the top face of the vacuum chamber and a wall portion forming the inner side face thereof such that the conveying arm assembly is situated in the vacuum chamber.

Although the magnetic and optical rotation detecting portions acting as the rotation detecting portions have been described in the above-mentioned embodiments, various other well-known detecting means can be used as the rotation detecting portion.

While the ball screw mechanism acting as the lift mechanism for bringing the conveying arm assembly up and down has been described in the above-mentioned embodiments, various well-known mechanisms such as a crank mechanism and the like can be employed as the lift mechanisms.

Numerous modifications and alternative embodiments of the invention will be apparent to those skilled in the art in view of the foregoing description. Accordingly, this description is to be construed as illustrative only, and is provided for the purpose of teaching those skilled in the art the best mode of carrying out the invention.

What is claimed is:

1. A conveying device comprising:

two conveying arm assemblies;

a fixed shaft defining a middle portion;

two sets of hollow operating shafts connected to the two conveying arm assemblies for controlling operations of the conveying arm assemblies, respectively; and a motor provided between the fixed shaft and each of the operating shafts, wherein an end of the fixed shaft is attached to an inner face of a wall portion of a vacuum chamber with airtightness, the two sets of operating shafts are attached to the fixed shaft such that they can be rotated coaxially with respect to the fixed shaft on an outside of the fixed shaft and are arranged as two units in an axial direction of the fixed shaft so that each set of operating shafts defines at least a proximal operating shaft attached closer to the middle portion of the fixed shaft and a distal operating shaft attached farther from the middle portion of the fixed shaft, the two conveying arm assemblies are attached to end portions of the proximal and distal operating shafts of respective sets of operating shafts to extend from the end portions of the proximal operating shafts in a direction substantially orthogonal to each other, respectively, the end portions being situated closer to the middle portion of the fixed shaft and adjacent to each other, and the proximal operating shafts of the two sets of operating shafts being adjacent to each other, the motor comprises a stator provided on the fixed shaft and a rotor provided on each of the operating shafts such that the rotor is opposed to the stator on an outside of the stator, and the stator is accommodated in a concave portion formed on an outer peripheral face of the fixed shaft.

2. The conveying device of claim 1, wherein the fixed shaft is constituted by two fixed shaft portions, each of which is for each set of the two sets of operating shafts, and the middle portion comprises a connecting portion connecting the two fixed shaft portions.

3. The conveying device of claim 1, wherein an opening of the concave portion is closed by a separating wall member and a passage communicating with the concave portion is formed in an end face of the fixed shaft that is attached to the vacuum chamber.

4. The conveying device of claim 1, wherein the fixed shaft includes a cylindrical portion extending over a central portion of the fixed shaft.

* * * * *

UNITED STATES PATENT AND TRADEMARK OFFICE
CERTIFICATE OF CORRECTION

PATENT NO.         : 6,755,092 B2
APPLICATION NO. : 10/354835
DATED              : June 29, 2004
INVENTOR(S)        : Takenori Wakabayashi et al.

It is certified that error appears in the above-identified patent and that said Letters Patent is hereby corrected as shown below:

On the title page item (73), insert the Assignee information --Assignee: Daihen Corporation, Osaka (JP)--.

Signed and Sealed this

Second Day of October, 2007

JON W. DUDAS
*Director of the United States Patent and Trademark Office*